(12) United States Patent
Lee et al.

(10) Patent No.: US 11,683,956 B2
(45) Date of Patent: Jun. 20, 2023

(54) DISPLAY DEVICE

(71) Applicant: Samsung Display Co., Ltd., Yongin-si (KR)

(72) Inventors: Pilsuk Lee, Suwon-si (KR); Yoomin Ko, Suwon-si (KR); Sunho Kim, Seongnam-si (KR); Juchan Park, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 17/863,005

(22) Filed: Jul. 12, 2022

(65) Prior Publication Data
US 2023/0125943 A1  Apr. 27, 2023

(30) Foreign Application Priority Data

Oct. 21, 2021 (KR) ........................ 10-2021-0140667

(51) Int. Cl.
*H10K 50/86* (2023.01)
*H01L 51/52* (2006.01)
*H01L 27/32* (2006.01)

(52) U.S. Cl.
CPC ...... *H01L 51/5284* (2013.01); *H01L 27/3262* (2013.01); *H01L 27/3276* (2013.01)

(58) Field of Classification Search
CPC ............. H01L 27/3262; H01L 27/3272; H01L 27/3276; H01L 51/5284
See application file for complete search history.

(56) References Cited

U.S. PATENT DOCUMENTS

| 6,348,959 | B1* | 2/2002 | Melnick ................ G02F 1/1339 |
| | | | 349/110 |
| 9,818,803 | B2 | 11/2017 | Lee et al. |
| 10,147,777 | B2 | 12/2018 | Kim et al. |
| 10,629,125 | B2 | 4/2020 | Kim et al. |
| 11,063,093 | B2 | 7/2021 | Kim et al. |
| 2016/0254338 | A1* | 9/2016 | Lin .................... H01L 29/78675 |
| | | | 257/40 |
| 2018/0151120 | A1* | 5/2018 | Kim ...................... G09G 3/3258 |
| 2020/0103697 | A1* | 4/2020 | Tan .................... G02F 1/133514 |

FOREIGN PATENT DOCUMENTS

| KR | 101615332 B1 | 4/2016 |
| KR | 20180018960 A | 2/2018 |
| KR | 20190002934 A | 1/2019 |
| KR | 20200080487 A | 7/2020 |

\* cited by examiner

*Primary Examiner* — Kevin M Nguyen
(74) *Attorney, Agent, or Firm* — Cantor Colburn LLP

(57) ABSTRACT

A display device includes a display panel that displays an image and including a first display area, in which a plurality of first pixels is disposed, and a second display area which is adjacent to the first display area and in which a plurality of second pixels is disposed and a gate driving block which overlaps the second display area and transmits driving signals to the plurality of first pixels and the plurality of second pixels. Each of the plurality of first pixels includes a first shielding layer. Each of the plurality of second pixels includes a second shielding layer. A first common voltage is applied to the first shielding layer, and a second common voltage having a voltage level different from a voltage level of the first common voltage is applied to the second shielding layer.

26 Claims, 15 Drawing Sheets

DISPLAY DEVICE

This application claims priority to Korean Patent Application No. 10-2021-0140667, filed on Oct. 21, 2021, and all the benefits accruing therefrom under 35 U.S.C. § 119, the content of which in its entirety is herein incorporated by reference.

BACKGROUND

1. Field

Embodiments of the invention described herein relate to a display device including a display panel.

2. Description of the Related Art

Various types of display devices are being used to provide image information.

A display device includes a display panel that displays an image. Nowadays, with a demand of a market, research is being conducted to reduce an area where an image is not displayed on the display device. At the same time, research is being conducted to expand a display area where the image is displayed to a user on the display device.

SUMMARY

Embodiments of the invention provide a display device capable of enlarging a display area for displaying an image and preventing the display quality from being deteriorated in the enlarged display area.

In an embodiment of the invention, a display device includes a display panel displaying an image and including a first display area, in which a plurality of first pixels is disposed, and a second display area which is adjacent to the first display area and in which a plurality of second pixels is disposed. The display device includes a gate driving block overlapping the second display area and transmitting driving signals to the plurality of first pixels and the plurality of second pixels. Each of the plurality of first pixels includes a first shielding layer, and each of the plurality of second pixels includes a second shielding layer. A first common voltage is applied to the first shielding layer, and a second common voltage having a voltage level different from a voltage level of the first common voltage is applied to the second shielding layer.

In an embodiment, the first shielding layer and the second shielding layer may be spaced apart from each other and to be electrically insulated from each other.

In an embodiment, each of the plurality of first pixels may further include a first light-emitting element and a first driving transistor electrically connected to the first light-emitting element. The first shielding layer may correspond to the first driving transistor. Each of the plurality of second pixels may further include a second light-emitting element and a second driving transistor electrically connected to the second light-emitting element. The second shielding layer may correspond to the second driving transistor.

In an embodiment, each of the plurality of second pixels may further include at least one dummy light-emitting element electrically connected to the second driving transistor.

In an embodiment, a length of a channel area of the first driving transistor may be greater than a length of a channel area of the second driving transistor.

In an embodiment, the display device further may include a reference voltage line, which is electrically connected to the gate driving block and to which the second common voltage is applied.

In an embodiment, the second common voltage may include a first gate driving voltage having a first voltage level and a second gate driving voltage having a second voltage level higher than the first voltage level. The reference voltage line may include a first driving voltage line to which the first gate driving voltage is applied and a second driving voltage line to which the second gate driving voltage is applied.

In an embodiment, the second shielding layer may be electrically connected to the first driving voltage line.

In an embodiment, the second shielding layer may be electrically connected to the second driving voltage line.

In an embodiment, the driving signals may include a scan signal applied to the plurality of first pixels and the plurality of second pixels. The gate driving block may include a first signal generation block generating the scan signal.

In an embodiment, the reference voltage line may include a first reference voltage line applying the second common voltage to the first signal generation block. The second shielding layer may be electrically connected to the first reference voltage line.

In an embodiment, the driving signals may further include an initialization scan signal, which is applied to the plurality of first pixels and the plurality of second pixels and which is different from the scan signal. The gate driving block may further include a second signal generation block generating the initialization scan signal.

In an embodiment, the reference voltage line may include a second reference voltage line applying the second common voltage to the second signal generation block. The second shielding layer may be electrically connected to the second reference voltage line.

In an embodiment, the driving signals may further include an emission signal for controlling timing at which the plurality of first pixels and the plurality of second pixels emit light. The gate driving block further may include a third signal generation block generating the emission signal.

In an embodiment, the reference voltage line may include a third reference voltage line applying the second common voltage to the third signal generation block. The second shielding layer may be electrically connected to the third reference voltage line.

In an embodiment, each of the first shielding layer and the second shielding layer may include a plurality of shielding layers. The plurality of shielding layers of the first shielding layer may be electrically connected to one another, and the plurality of shielding layers of the second shielding layer may be electrically connected to one another.

In an embodiment, the display panel may further include an outer line interposed between the gate driving block and the second shielding layers and which is electrically connected to the second shielding layers. The second common voltage may be applied to the outer line.

In an embodiment of the invention, a display device includes a display panel displaying an image and including a first display area, in which a plurality of first pixels is disposed, and a second display area which is adjacent to the first display area and in which a plurality of second pixels is disposed. The display device includes a gate driving block transmitting driving signals to the plurality of first pixels and the plurality of second pixels. The display device includes a common voltage line, which is electrically connected to the plurality of first pixels and the plurality of second pixels and to which a first common voltage is applied. The display device includes a reference voltage line, which is electrically connected to the gate driving block and which is used to apply a second common voltage having a voltage level different from the first common voltage to the gate driving block. Each of the plurality of first pixels includes a first shielding layer, and each of the plurality of second pixels includes a second shielding layer. The first common voltage is applied to the first shielding layer, and the second common voltage is applied to the second shielding layer.

In an embodiment, the first shielding layer and the second shielding layer may be spaced apart from each other and to be electrically insulated from each other.

In an embodiment, each of the plurality of first pixels may further include a first light-emitting element and a first driving transistor electrically connected to the first light-emitting element. The first shielding layer may correspond to the first driving transistor. Each of the plurality of second pixels may further include a second light-emitting element and a second driving transistor electrically connected to the second light-emitting element. The second shielding layer may correspond to the second driving transistor.

In an embodiment, each of the plurality of second pixels may further include at least one dummy light-emitting element electrically connected to the second driving transistor.

In an embodiment, the display device may further include a voltage generation block generating the first common voltage and the second common voltage, applying the first common voltage to the common voltage line, and applying the second common voltage to the reference voltage line.

In an embodiment, the second common voltage may include a first gate driving voltage having a first voltage level and a second gate driving voltage having a second voltage level higher than the first voltage level. The reference voltage line includes a first driving voltage line which receives the first gate driving voltage from the voltage generation block and a second driving voltage line which receives the second gate driving voltage from the voltage generation block.

In an embodiment, the first shielding layer may be electrically connected to the common voltage line. The second shielding layer may be electrically connected to the first driving voltage line.

In an embodiment, the first shielding layer may be electrically connected to the common voltage line. The second shielding layer may be electrically connected to the second driving voltage line.

In an embodiment, the gate driving block may overlap the second display area.

BRIEF DESCRIPTION OF THE DRAWINGS

The above and other objects and features of the invention will become apparent by describing in detail embodiments thereof with reference to the accompanying drawings.

DETAILED DESCRIPTION

Figure 1:
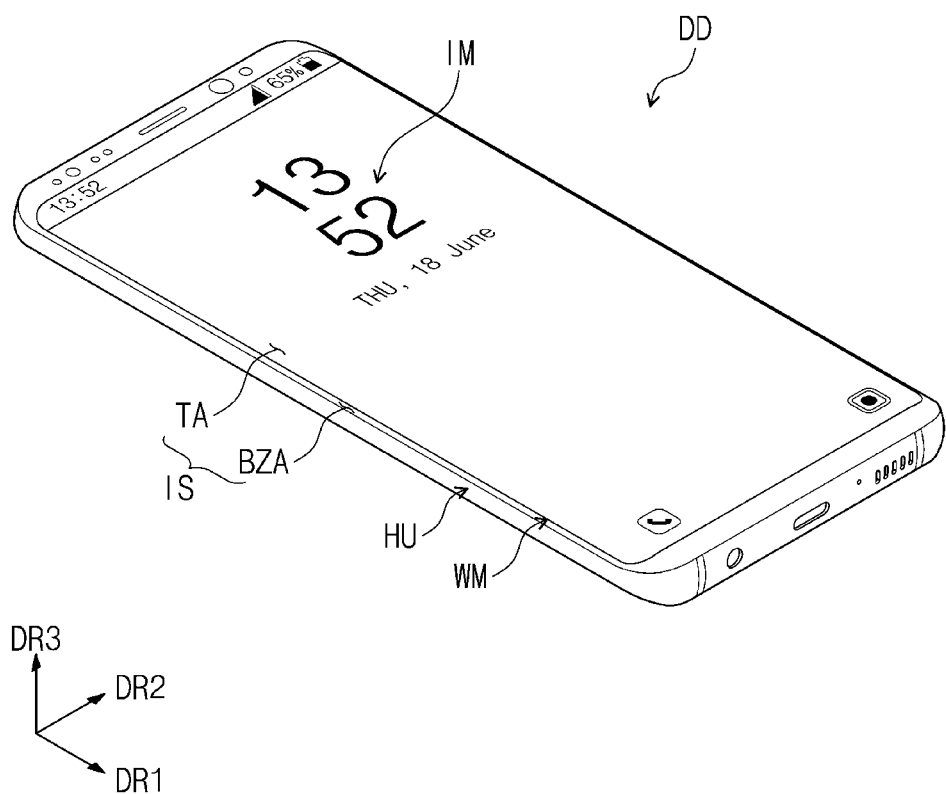
FIG. 1 is a perspective view of an embodiment of a display device, according to the invention.

In the specification, the expression that a first component (or region, layer, part, portion, etc.) is "on", "connected with", or "coupled with" a second component means that the first component is directly on, connected with, or coupled with the second component or means that a third component is interposed therebetween.

The same reference numerals refer to the same components. Also, in drawings, the thickness, ratio, and dimension of components are exaggerated for effectiveness of description of technical contents. The expression "and/or" includes one or more combinations which associated components are capable of defining.

Although the terms "first", "second", etc. may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The articles "a," "an," and "the" are singular in that they have a single referent, but the use of the singular form in the specification should not preclude the presence of more than one referent.

Also, the terms "under", "below", "on", "above", etc. are used to describe the correlation of components illustrated in drawings. The terms that are relative in concept are described based on a direction shown in drawings.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical terms and scientific terms) used in the specification have the same meaning as commonly understood by one skilled in the art to which the disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein. In the disclosure, a term such as "block" may mean a circuitry block which is a hardware component.

Hereinafter, embodiments of the invention will be described with reference to accompanying drawings.

Figure 2:
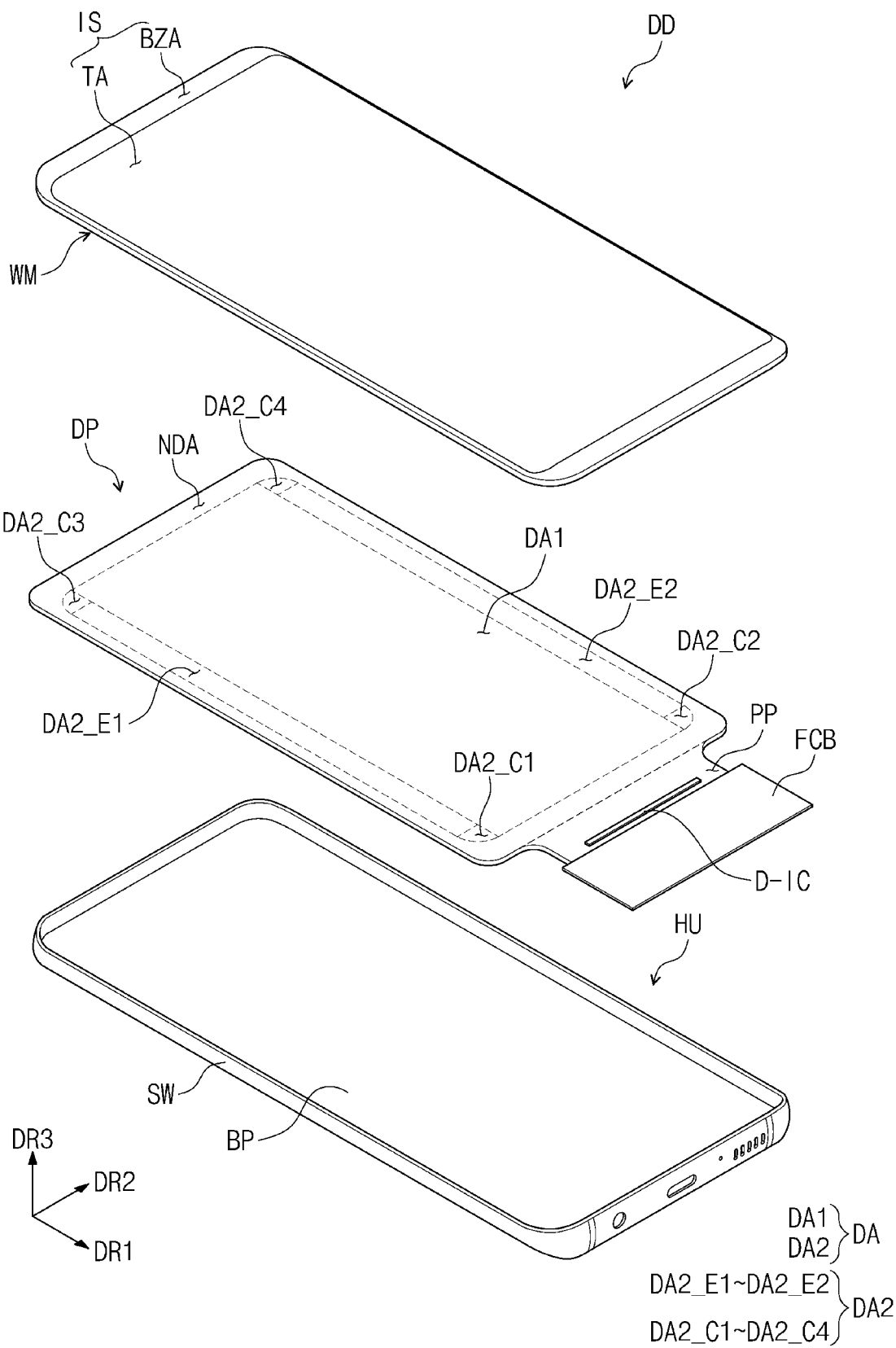
FIG. 2 is an exploded perspective view of an embodiment of a display device, according to the invention.

FIG. 1 is a perspective view of an embodiment of a display device, according to the invention. FIG. 2 is an exploded perspective view of an embodiment of a display device, according to the invention.

Referring to FIGS. 1 and 2, a display device DD may be a device activated depending on an electrical signal. FIGS. 1 and 2 illustrate that the display device DD is a smartphone. However, the invention is not limited thereto. In an embodiment, as well as a large-sized display device, such as a television, a monitor, or the like, the display device DD may be a small and medium-sized display device, such as a tablet personal computer ("PC"), a notebook computer, a vehicle navigation system, a game console, or the like. The above examples are provided only in an embodiment, and it is obvious that the display device DD may be applied to any other display device(s) without departing from the concept of the invention.

The display device DD has a long side in a first direction DR1 and a short side in a second direction DR2 intersecting the first direction DR1. The display device DD has a quadrangle including rounded corners. However, the shape of the display device DD is not limited thereto. In an embodiment, the display device DD may be implemented in various shapes, for example. The display device DD may display an image IM on a display surface IS parallel to each of the first direction DR1 and the second direction DR2, so as to face a third direction DR3. The display surface IS on which the image IM is displayed may correspond to a front surface of the display device DD.

In an embodiment, a front surface (or an upper/top surface) and a rear surface (or a lower/bottom surface) of each member are defined based on a direction in which the image IM is displayed. The front surface and the rear surface may be opposite to each other in the third direction DR3, and a normal direction of each of the front surface and the rear surface may be parallel to the third direction DR3.

A separation distance between the front surface and the rear surface in the third direction DR3 may correspond to a thickness of the display device DD in the third direction DR3. Directions that the first, second, and third directions DR1, DR2, and DR3 indicate may be relative in concept and may be changed to different directions.

The display surface IS of the display device DD may be divided into a transparent area TA and a bezel area BZA. The transparent area TA may be an area in which the image IM is displayed. A user visually perceives the image IM through the transparent area TA. In an embodiment, the transparent area TA is illustrated in the shape of a quadrangle including rounded corners. However, this is merely one of embodiments. The transparent area TA may have various shapes, not limited to an embodiment.

The bezel area BZA is adjacent to the transparent area TA. The bezel area BZA may have a predetermined color. The bezel area BZA may surround the transparent area TA. Accordingly, the shape of the transparent area TA may be substantially defined by the bezel area BZA. However, this is merely one of embodiments. In an embodiment, the bezel area BZA may be disposed adjacent to only one side of the transparent area TA or may be omitted. The display device DD in an embodiment of the invention may include various embodiments and is not limited to an embodiment.

As illustrated in FIG. 2, the display device DD may include a window WM, a display panel DP, and housing HU.

The window WM protects an upper surface of the display panel DP. The window WM may be optically transparent. The window WM may include a transparent material capable of outputting the image IM. In an embodiment, the window WM may include glass, sapphire, plastic, etc. An example in which the window WM is implemented with a single layer is illustrated, but the invention is not limited thereto. In an embodiment, the window WM may include a plurality of layers.

Although not illustrated in drawings, the bezel area BZA of the display device DD described above may correspond to an area that is defined by printing a material including a given color on one area of the window WM. In an embodiment of the invention, the window WM may include a light-blocking pattern for defining the bezel area BZA. The light-blocking pattern, which has the form of an organic film having a color, may be, for example, formed or provided in a coating manner.

The window WM may be coupled to the display panel DP through an adhesive film. In an embodiment of the invention, the adhesive film may include an optically clear adhesive ("OCA") film. However, the adhesive film is not limited thereto. In an embodiment, the adhesive film may include a typical adhesive or sticking agent, for example. In an embodiment, the adhesive film may include an optically clear resin ("OCR") or a pressure sensitive adhesive ("PSA") film, for example.

An anti-reflection layer may be further interposed between the window WM and the display panel DP. The anti-reflection layer decreases reflectivity of an external light incident from above the window WM. The anti-reflection layer in an embodiment of the invention may include a retarder and a polarizer. The retarder may be a retarder of a film type or a liquid crystal coating type and may include a λ/2 retarder and/or a λ/4 retarder. The polarizer may also have a film type or a liquid crystal coating type. The film type may include a stretch-type synthetic resin film, and the liquid crystal coating type may include liquid crystals arranged in a given direction. The retarder and the polarizer may be implemented with one polarization film.

In an embodiment of the invention, the anti-reflection layer may also include color filters. An array of color filters may be determined in consideration of colors of lights generated from a plurality of pixels PX (refer to FIG. 3) included in the display panel DP. Also, the anti-reflection layer may further include a light-blocking pattern.

The display panel DP may include a display area DA displaying an image IM. In an embodiment of the invention, the display area DA may include a first display area DA1 and a second display area DA2. In an embodiment, it is illustrated that the display device DD is in a quadrangular (e.g., rectangular) shape having a long side in a first direction DR1 and a short side in a second direction DR2. However, this is merely one of embodiments. The first display area DA1 may have various shapes, not limited to an embodiment.

The second display area DA2 is adjacent to the first display area DA1. In an embodiment, the second display area DA2 is disposed adjacent to two long sides of the first display area DA1. However, this is merely one of embodiments. The second display area DA2 is disposed adjacent to only one long side of the first display area DA1, or may be disposed adjacent to two long sides and one short side of the first display area DA1. Furthermore, the second display area DA2 may surround the first display area DA1.

The second display area DA2 includes a plurality of corner areas (DA2_C1 DA2_C2, DA2_C3, DA2_C4) and a plurality of edge areas (DA2_E1, DA2_E2) so as to correspond to the display device DD having a rounded quadrangular (e.g., rounded rectangular) shape. In an embodiment of the invention, the corner areas (DA2_C1 DA2_C2, DA2_C3, DA2_C4) include the first corner area DA2_C1, the second corner area DA2_C2, the third corner area DA2_C3, and the fourth corner area DA2_C4. The edge areas (DA2_E1, DA2_E2) include the first edge area DA2_E1 and the second edge area DA2_E2. In an embodiment of the invention, the first edge area DA2_E1 is disposed between the first corner area DA2_C1 and the third corner area DA2_C3. The second edge area DA2_E2 is disposed between the second corner area DA2_C2 and the fourth corner area DA2_C4.

In an embodiment of the invention, it is illustrated that the second display area DA2 includes four corner areas (DA2_C1 to DA2_C4). However, the structure of the display panel DP of the invention is not limited thereto. In an embodiment of the invention, the second display area DA2 of the display panel DP may include only two corner areas.

In an embodiment of the invention, it is illustrated that the second display area DA2 includes two edge areas (DA2_E1, DA2_E2). However, the structure of the display panel DP of the invention is not limited thereto. In an embodiment of the invention, the second display area DA2 of the display panel DP may include only one edge area.

The display panel DP may include a non-display area NDA around the display area DA. The non-display area NDA is an area where an image is not actually displayed. The non-display area NDA may surround the first display area DA1 and the second display area DA2.

In an embodiment of the invention, the display panel DP may include a light-emitting display panel. In an embodiment, the display panel DP may be an organic light-emitting display panel, an inorganic light-emitting display panel, a quantum dot light-emitting display panel. An emission layer of the organic light-emitting display layer may include an organic light-emitting material. An emission layer of the inorganic light-emitting display panel may include an inorganic light-emitting material. An emission layer of the quantum dot light-emitting display panel may include a quantum dot and a quantum rod. Hereinafter, the description will be given under the condition that the display panel DP is an organic light-emitting display panel in an embodiment.

In an embodiment of the invention, the display device DD may further include an input sensing layer for sensing an external input (e.g., a touch event, or the like). The input sensing layer may be directly disposed on the display panel DP. In an embodiment of the invention, the input sensing layer may be formed or disposed on the display panel DP through a subsequent process. That is, when the input sensing layer is directly disposed on the display panel DP, an adhesive film may not be interposed between the input sensing layer and the display panel DP. However, the invention is not limited thereto. The adhesive film may be interposed between the input sensing layer and the display panel DP. In this case, the input sensing layer is not fabricated together with the display panel DP through the subsequent processes. In other words, after fabricating the input sensing layer through a process separate from that of the display panel DP, the input sensing layer may be fixed on a top surface of the display panel DP through the adhesive film.

In an embodiment of the invention, the display device DD may further include a driver chip D-IC and a flexible circuit film FCB. In an embodiment of the invention, the display panel DP may further include a pad area PP extending from the second display area DA2. It is illustrated that the pad area PP extends in the first direction DR1 from the second display area DA2, but the invention is not limited thereto. In an embodiment, the pad area PP may extend from the second display area DA2 in the second direction DR2. Moreover, the pad area PP may include a first pad area extending from the second display area DA2 in the first direction DR1 and a second pad area extending from the second display area DA2 in the second direction DR2. In an embodiment of the invention, among the first to fourth corner areas (DA2_C1, DA2_C2, DA2_C3, DA2_C4), the first corner area DA2_C1 and the second corner area DA2_C2 are areas close to the pad area PP, and the third corner area DA2_C3 and the fourth corner area DA2_C4 are the areas far from the pad area PP.

The driver chip D-IC and pads may be disposed in the pad area PP. The display panel DP may be electrically connected to the flexible circuit film FCB through the pads. In an embodiment of the invention, the driver chip D-IC may be disposed (e.g., mounted) on the flexible circuit film FCB. The flexible circuit film FCB may include a plurality of driving elements. The plurality of driving elements may include a circuit unit for driving the display panel DP. In an embodiment of the invention, the driver chip D-IC may include a source driving block SDB (refer to FIG. 3) and a voltage generation block VGB (refer to FIG. 3).

In an embodiment of the invention, the pad area PP may be bent to be disposed on a rear surface of the display panel DP.

The housing HU includes a bottom part BP and a side wall SW. The side wall SW may be extended from the bottom part BP. The housing HU may accommodate the display panel DP in the accommodation space defined by the bottom part BP and the side wall SW. The window WM may be coupled with the side wall SW of the housing HU. The side wall SW of the housing HU may support an outer portion of the window WM. The housing HU may be coupled with the window WM to define the exterior appearance of the display device DD. The housing HU may include a material having relatively high rigidity. In an embodiment, the housing HU may include glass, plastic, or metal or may include a plurality of frames and/or a plurality of plates composed of any combinations thereof. The housing HU may stably protect configurations of the display device DD accommodated in the inner space from an external impact.

Figure 3:
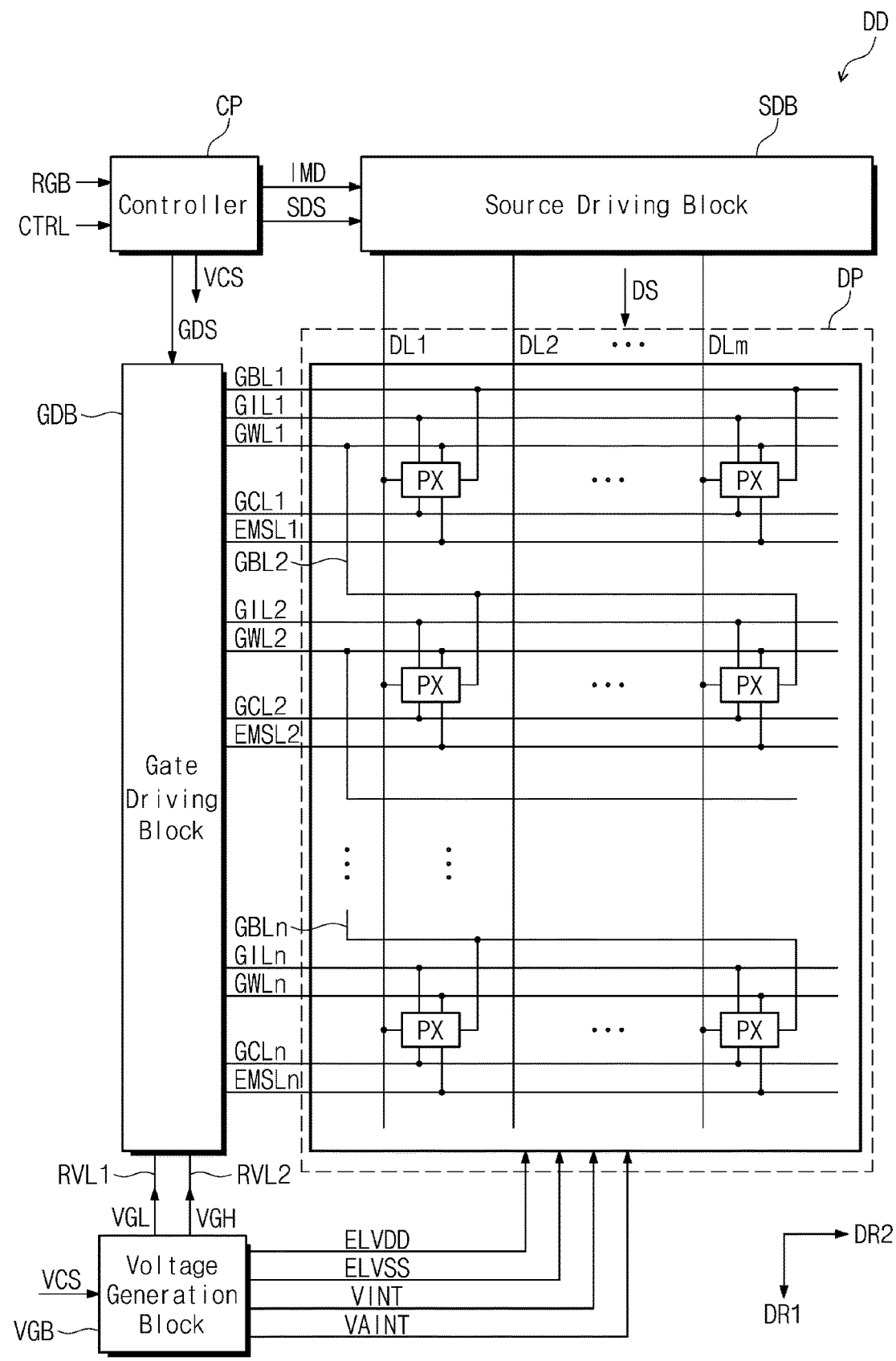
FIG. 3 is a block diagram of an embodiment of a display device, according to the invention.
Figure 4:
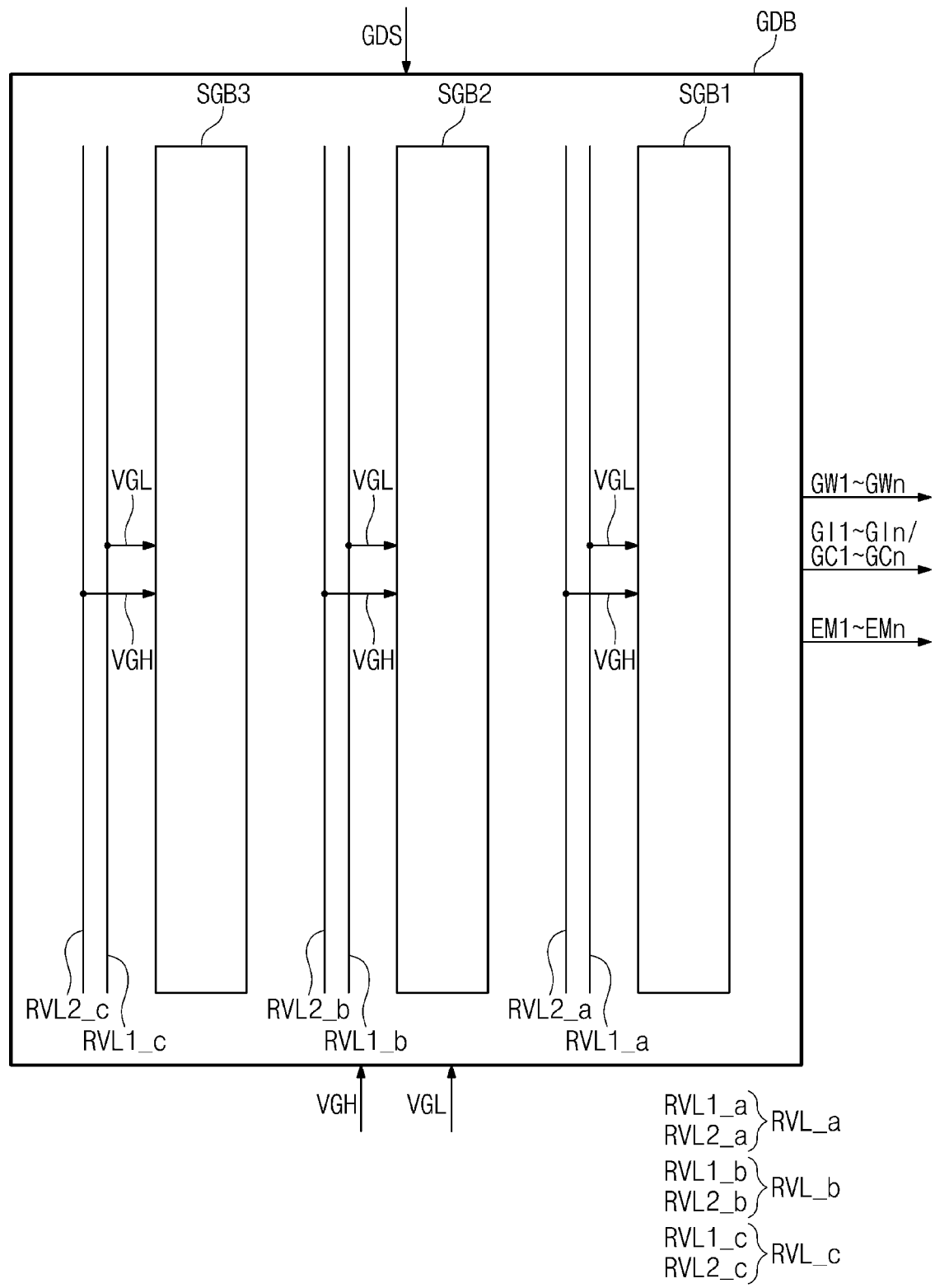
FIG. 4 is a block diagram of an embodiment of a gate driving block, according to the invention.

FIG. 3 is a block diagram of an embodiment of a display device, according to the invention. FIG. 4 is a block diagram of an embodiment of a gate driving block, according to the invention.

Referring to FIGS. 3 and 4, the display device DD may include the display panel DP, a controller CP, the source driving block SDB, a gate driving block GDB, and the voltage generation block VGB.

In an embodiment of the invention, the display panel DP includes a plurality of pixels PX, a plurality of scan lines GWL1 to GWLn, a plurality of initialization lines GIL1 to GILn, a plurality of compensation lines GCL1 to GCLn, a plurality of emission initialization lines GBL1 to GBLn, a plurality of emission lines EMSL1 to EMSLn, and a plurality of data lines DL1 to DLm. Here, n and m are natural numbers.

Each of the pixels PX may include light-emitting element that generates color light. In an embodiment, the pixels PX may include red pixels generating red light, green pixels generating green light, and blue pixels generating blue light, for example. A light-emitting element of a red pixel, a light-emitting element of a green pixel, and a light-emitting element of a blue pixel may include emission layers of different materials. In an embodiment of the invention, each of the pixels PX may include white pixels generating white light. In this case, an anti-reflection layer included in the display device DD may further include color filters. The display device DD may display the image IM (refer to FIG. 1) based on light output after the white light passes through the color filters. However, in an embodiment of the invention, the pixels PX may include blue pixels that generate blue light. In this case, the display device DD may display the image IM based on light output after the blue light passes through the color filters. In an embodiment of the invention, when the blue light passes through the color filters, the passing light may have a color having a wavelength different from that of the blue light. In an embodiment of the invention, each of the color filters may include a quantum dot. The quantum dot is a particle capable of controlling the wavelength of light emitted by converting the wavelength of incident light. The quantum dot may control the wavelength of light emitted depending on a particle size. Accordingly, the quantum dot may emit light having the red light, the green light, and the blue light.

The controller CP receives an image signal RGB and a control signal CTRL. The controller CP generates image data IMD by converting the data format of the image signal RGB so as to be suitable for the interface specification with the source driving block SDB. The controller CP generates a source driving signal SDS, a gate control signal GDS, and a voltage control signal VCS based on the control signal CTRL. In an embodiment of the invention, the control signal CTRL may include a vertical synchronization signal, a horizontal synchronization signal, a main clock, or the like.

The controller CP provides the image data IMD and the source driving signal SDS to the source driving block SDB. The source driving signal SDS may include a horizontal start signal for starting an operation of the source driving block SDB. In response to the source driving signal SDS, the source driving block SDB generates a data signal DS based on the image data IMD. The source driving block SDB outputs the data signal DS to the plurality of data lines DL1 to DLm to be described later. The data signal DS may refer to an analog voltage corresponding to a grayscale value of the image data IMD.

The controller CP transmits the voltage control signal VCS to the voltage generation block VGB. The voltage generation block VGB generates voltages desired for an operation of the display panel DP based on the voltage control signal VCS. In an embodiment of the invention, the voltage generation block VGB generates a first power supply voltage ELVDD, a second power supply voltage ELVSS, a first initialization voltage VINT, a second initialization voltage VAINT, a first gate driving voltage VGL, and a second gate driving voltage VGH. In an embodiment of the invention, the first gate driving voltage VGL has a first voltage level, and the second gate driving voltage VGH has a second voltage level higher than the first voltage level. The first voltage level may be approximately −8 volts (V) to approximately −10 V. The second voltage level may be approximately 8 V to approximately 10 V. In an embodiment of the invention, a voltage level of the first power supply voltage ELVDD is greater than a voltage level of the second power supply voltage ELVSS. In an embodiment of the invention, the voltage level of the first power supply voltage ELVDD may be approximately 4 V to approximately 7 V. The voltage level of the second power supply voltage ELVSS may be approximately 0 V to approximately −3 V. The voltage level of the first initialization voltage VINT may be approximately −3.5 V to approximately −5 V. The voltage level of the second initialization voltage VAINT may be approximately −3.5 V to approximately −5 V. In an embodiment of the invention, the first initialization voltage VINT and the second initialization voltage VAINT may have the same voltage level as each other. The voltage generation block VGB applies the first power supply voltage ELVDD, the second power supply voltage ELVSS, the first initialization voltage VINT, and the second initialization voltage VAINT to the display panel DP.

The controller CP transmits the gate control signal GDS to the gate driving block GDB. Furthermore, the voltage generation block VGB applies the first gate driving voltage VGL and the second gate driving voltage VGH to the gate driving block GDB through reference voltage lines RVL1 and RVL2. In an embodiment of the invention, the reference voltage lines RVL1 and RVL2 include the first driving voltage line RVL1 and the second driving voltage line RVL2. The voltage generation block VGB applies the first gate driving voltage VGL to the gate driving block GDB through the first driving voltage line RVL1. The voltage generation block VGB applies the second gate driving voltage VGH to the gate driving block GDB through the second driving voltage line RVL2.

The gate driving block GDB generates the plurality of driving signals (GW1 to GWn, GI1 to GIn, GC1 to GCn, EM1 to EMn) based on the gate control signal GDS, the first gate driving voltage VGL, and the second gate driving voltage VGH.

The driving signals (GW1 to GWn, GI1 to GIn, GC1 to GCn, EM1 to EMn) include the plurality of scan signals GW1 to GWn, the plurality of initialization scan signals GI1 to GIn, the plurality of compensation scan signals GC1 to GCn, and the plurality of emission signals EM1 to EMn.

In an embodiment of the invention, the gate driving block GDB may include a first signal generation block SGB1 generating the scan signals GW1 to GWn, a second signal generation block SGB2 generating the initialization scan signals GI1 to Gin and the compensation scan signals GC1 to GCn, and a third signal generation block SGB3 generating the emission signals EM1 to EMn.

Figure 6:
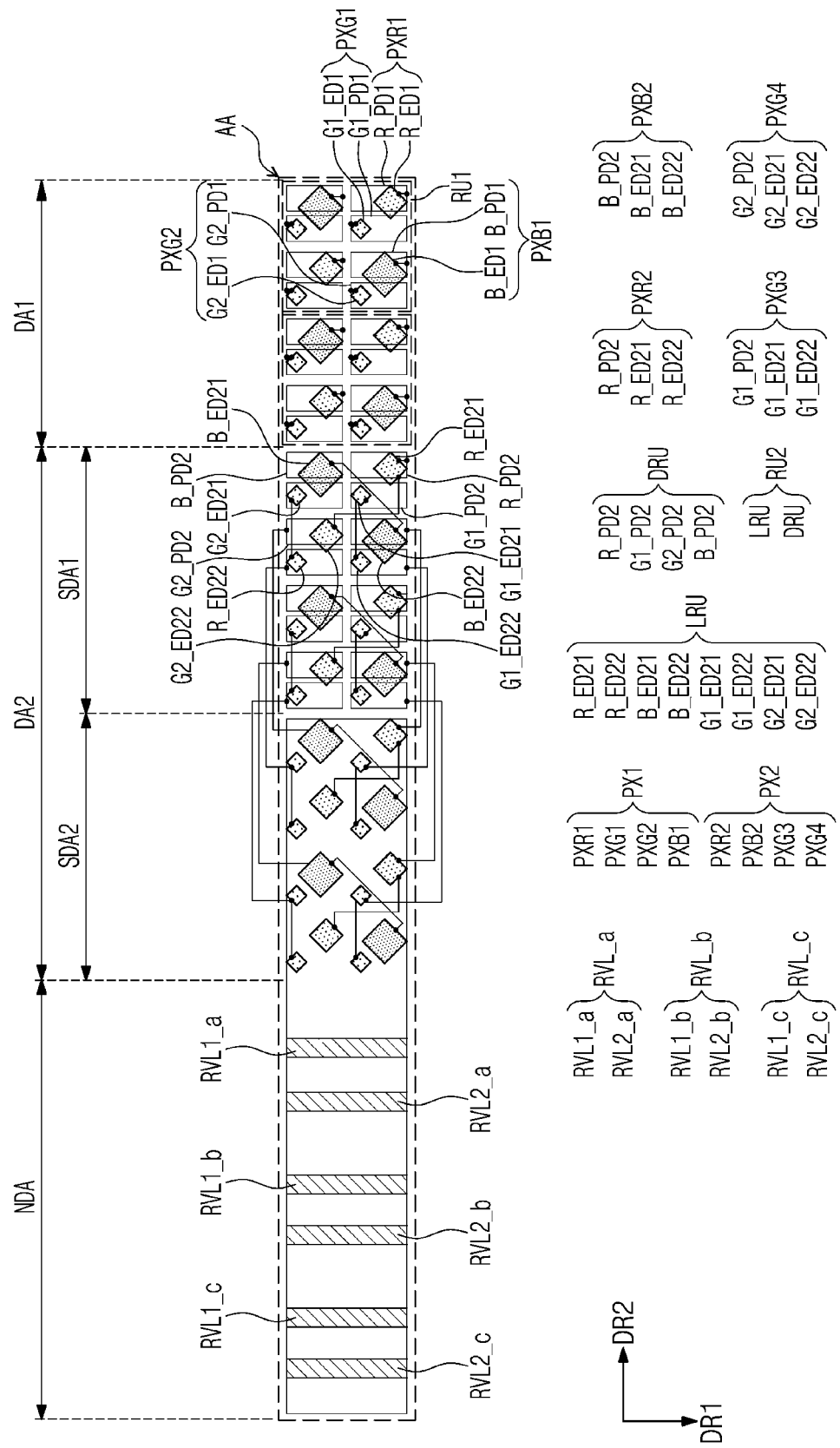
FIG. 6 is a plan view illustrating light-emitting elements and driving circuits that are disposed in an area AA shown in FIG. 5.

In an embodiment of the invention, the first driving voltage line RVL1 may include a first sub voltage line RVL1_$a$ (refer to FIG. 6), a third sub voltage line RVL1_$b$ (refer to FIG. 6), and a fifth sub voltage line RVL1_$c$ (refer to FIG. 6). The second driving voltage line RVL2 may include a second sub voltage line RVL2_$a$ (refer to FIG. 6), a fourth sub voltage line RVL2_$b$ (refer to FIG. 6), and a sixth sub voltage line RVL2_$c$ (refer to FIG. 6).

The gate driving block GDB applies the first gate driving voltage VGL to the first signal generation block SGB1 through the first sub voltage line RVL1_$a$ and applies the second gate driving voltage VGH to the first signal generation block SGB1 through the second sub voltage line RVL2_$a$. In an embodiment of the invention, a reference voltage line RVL_a including the first sub voltage line RVL1_a and the second sub voltage line RVL2_a may be also referred to as a first reference voltage line RVL_a.

The gate driving block GDB applies the first gate driving voltage VGL to the second signal generation block SGB2 through the third sub voltage line RVL1_b and applies the second gate driving voltage VGH to the second signal generation block SGB2 through the fourth sub voltage line RVL2_b. In an embodiment of the invention, a reference voltage line RVL_b including the third sub voltage line RVL1_b and the fourth sub voltage line RVL2_b may be also referred to as a second reference voltage line RVL_b.

The gate driving block GDB applies the first gate driving voltage VGL to the third signal generation block SGB3 through the fifth sub voltage line RVL1_c and applies the second gate driving voltage VGH to the third signal generation block SGB3 through the sixth sub voltage line RVL2_c. In an embodiment of the invention, a reference voltage line RVL_c including the fifth sub voltage line RVL1_c and the sixth sub voltage line RVL2_c may be also referred to as a third reference voltage line RVL_c.

The gate driving block GDB outputs the scan signals GW1 to GWn to the plurality of scan lines GWL1 to GWLn, respectively. The gate driving block GDB outputs the initialization scan signals GI1 to GIn to the plurality of initialization lines GIL1 to GILn, respectively. The gate driving block GDB outputs the compensation scan signals GC1 to GCn to the plurality of compensation lines GCL1 to GCLn, respectively. The gate driving block GDB outputs the emission signals EM1 to EMn to the plurality of emission lines EMSL1 to EMSLn, respectively. The gate driving block GDB outputs the emission initialization signals to the plurality of emission initialization lines GBL1 to GBLn, respectively. In an embodiment of the invention, the gate driving block GDB may output a scan signal output to a k-th scan line as an emission initialization signal to another emission initialization line (e.g., a (k−1)-th or (k+1)-th emission initialization line) other than the k-th scan line. Here, k is a natural number equal to or less than n−1. In an embodiment of the invention, the gate driving block GDB may output the first scan signal GW1 to the first scan line GWL1 and the second emission initialization line GBL2.

Figure 5:
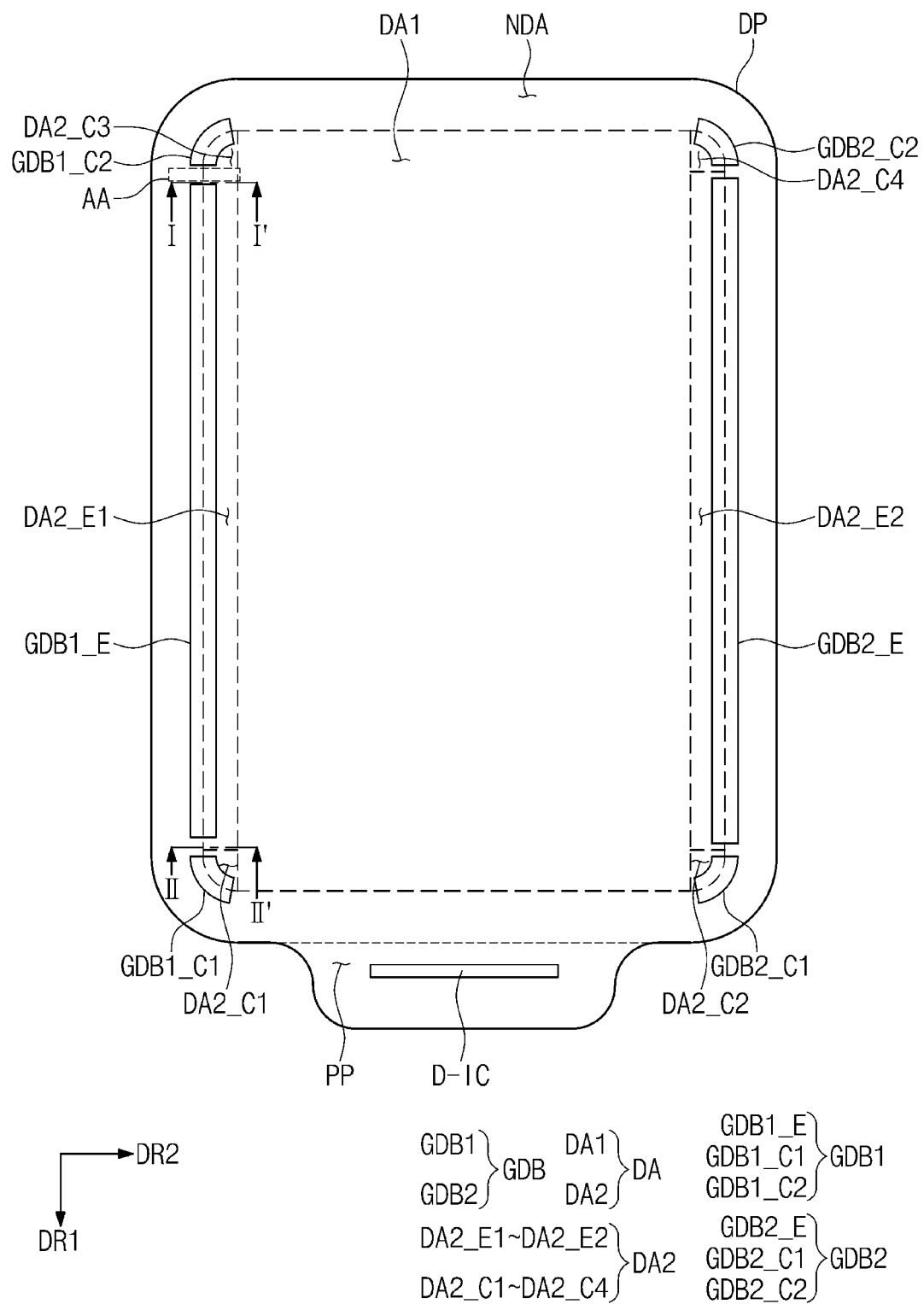
FIG. 5 is a plan view of an embodiment of a display panel, according to the invention.

FIG. 5 is a plan view of an embodiment of a display panel, according to the invention. Below, components that are the same as the components described with reference to FIG. 2 are marked by the same reference numerals, and thus, additional description will be omitted to avoid redundancy.

Referring to FIGS. 3 and 5, the gate driving block GDB may include a first gate driving block GDB1 and a second gate driving block GDB2. In an embodiment of the invention, the first gate driving block GDB1 may be disposed on one side with respect to the first display area DA1. The second gate driving block GDB2 may be disposed on the other side of the second display area DA2 spaced apart from the one side in the second direction DR2. The first gate driving block GDB1 and the second gate driving block GDB2 may generate the scan signals GW1 to GWn, the initialization scan signals GI1 to GIn, the compensation scan signals GC1 to GCn, and the emission signals EM1 to EMn and then may output the generated driving signals (GW1 to GWn, GI1 to GIn, GC1 to GCn, EM1 to EMn) to the corresponding pixels PX. In an embodiment of the invention, each of the first and second gate driving blocks GDB1 and GDB2 may include the first to third signal generation blocks SGB1, SGB2, and SGB3 (refer to FIG. 4).

The first and second gate driving blocks GDB1 and GDB2 may be built into the display panel DP. That is, the first and second gate driving blocks GDB1 and GDB2 may be formed or disposed directly on the display panel DP through a thin film process of forming the pixels PX on the display panel DP.

Each of the first and second gate driving blocks GDB1 and GDB2 may be disposed in the second display area DA2 or may partially overlap the second display area DA2. A part of each of the first and second gate driving blocks GDB1 and GDB2 may be disposed in the second display area DA2, thereby preventing the area size of the non-display area NDA from being increased by the first and second gate driving blocks GDB1 and GDB2. As a result, the area size of the non-display area NDA recognized by a user in the display device DD may be reduced by the second display area DA2.

In an embodiment of the invention, the first gate driving block GDB1 may include a first edge gate block GDB1_E, a first corner gate block GDB1_C1, and a second corner gate block GDB1_C2 so as to correspond to the second display area DA2 including the first to fourth corner areas DA2_C1, DA2_C2, DA2_C3, and DA2_C4. The first edge gate block GDB1_E may be disposed adjacent to an outer side of the first edge area DA2_E1. The first corner gate block GDB1_C1 may be disposed adjacent to an outer side of the first corner area DA2_C1. In an embodiment of the invention, the first edge gate block GDB1_E and the first corner gate block GDB1_C1 may be spaced apart from each other in the first direction DR1. The second corner gate block GDB1_C2 may be disposed adjacent to an outer side of the third corner area DA2_C3. In an embodiment of the invention, the first edge gate block GDB1_E and the second corner gate block GDB1_C2 may be spaced apart from each other in the first direction DR1.

In an embodiment of the invention, the second gate driving block GDB2 may include a second edge gate block GDB2_E, a third corner gate block GDB2_C1, and a fourth corner gate block GDB2_C2. The second edge gate block GDB2_E may be disposed adjacent to an outer side of the second edge area DA2_E2. The third corner gate block GDB2_C1 may be disposed adjacent to an outer side of the second corner area DA2_C2. In an embodiment of the invention, the second edge gate block GDB2_E and the third corner gate block GDB2_C1 may be spaced apart from each other in the first direction DR1. The fourth corner gate block GDB2_C2 may be disposed adjacent to an outer side of the fourth corner area DA2_C4. In an embodiment of the invention, the second edge gate block GDB2_E and the fourth corner gate block GDB2_C2 may be spaced apart from each other in the first direction DR1.

In an embodiment of the invention, among the first to fourth corner gate blocks GDB1_C1, GDB1_C2, GDB2_C1, and GDB2_C2, the first and third corner gate blocks GDB1_C1 and GDB2_C1 are disposed relatively close to the pad area PP, and the second and fourth corner gate blocks GDB1_C2 and GDB2_C2 are disposed relatively far from the pad area PP.

FIG. 6 is a plan view illustrating light-emitting elements and driving circuits that are disposed in an area AA shown in FIG. 5.

Referring to FIGS. 5 and 6, a plurality of first reference units RU1 may be repeatedly disposed in the second direction DR2 in the first display area DA1 of the display panel DP. Although not shown, the first reference units RU1 may be repeatedly disposed in the first direction DR1 in the first display area DA1. Each of the first reference units RU1 may include 'p' red pixels, 'q' green pixels, and 'p' blue pixels. Here, each of 'p' and 'q' is a natural number greater than or equal to 1, and 'q' may be greater than or equal to 'p'. In an embodiment of the invention, the pixels included in each of the first reference units RU1 may be also referred to as "first pixels PX1".

For convenience of description, a red pixel of the first pixels PX1 is also referred to as a "first red pixel PXR1", and a blue pixel of the first pixels PX1 is also referred to as a "first blue pixel PXB1". Moreover, among the first pixels PX1, a green pixel adjacent to the first red pixel PXR1 is also referred to as a "first green pixel PXG1", and a green pixel adjacent to the first blue pixel PXB1 is also referred to as a "second green pixel PXG2". In an embodiment of the invention, 'q' may be '2p'.

As illustrated in FIG. 6, two first red pixels PXR1, two first blue pixels PXB1, two first green pixels PXG1, and two second green pixels PXG2 may be included in each of the first reference units RU1. However, the number of pixels included in the first reference units RU1 is not limited thereto and may be variously changed.

Each of the first pixels PX1 includes first light-emitting elements (R_ED1, G1_ED1, G2_ED1, B_ED1) and first driving circuits (R_PD1, G1_PD1, G2_PD1, B_PD1) electrically connected to the first light-emitting elements (R_ED1, G1_ED1, G2_ED1, B_ED1), respectively. In an embodiment of the invention, the first light-emitting elements (R_ED1, G1_ED1, G2_ED1, B_ED1) include the first red light-emitting element R_ED1, the first green light-emitting element G1_ED1, the second green light-emitting element G2_ED1, and the first blue light-emitting element B_ED1. The first driving circuits (R_PD1, G1_PD1, G2_PD1, B_PD1) include the first red driving circuit R_PD1, the first green driving circuit G1_PD1, the second green driving circuit G2_PD1, and the first blue driving circuit B_PD1.

The first red pixel PXR1 includes the first red driving circuit R_PD1 and the first red light-emitting element R_ED1. The first red driving circuit R_PD1 may be electrically connected to the corresponding first red light-emitting element R_ED1 so as to control the driving of the first red light-emitting element R_ED1. The first green pixel PXG1 includes the first green driving circuit G1_PD1 and the first green light-emitting element G1_ED1. The first green driving circuit G1_PD1 may be electrically connected to the corresponding first green light-emitting element G1_ED1 so as to control the driving of the first green light-emitting element G1_ED1. The second green pixel PXG2 includes the second green driving circuit G2_PD1 and the second green light-emitting element G2_ED1. The second green driving circuit G2_PD1 may be electrically connected to the corresponding second green light-emitting element G2_ED1 so as to control the driving of the second green light-emitting element G2_ED1. The first blue pixel PXB1 includes the first blue driving circuit B_PD1 and the first blue light-emitting element B_ED1. The first blue driving circuit B_PD1 may be electrically connected to the corresponding first blue light-emitting element B_ED1 so as to control the driving of the first blue light-emitting element B_ED1. The first red light-emitting element R_ED1 outputs red light, the first and second green light-emitting elements G1_ED1 and G2_ED1 emit green light, and, the first blue light-emitting element B_ED1 outputs blue light.

The first red driving circuit R_PD1 may overlap the electrically-connected first red light-emitting element R_ED1. The first blue driving circuit B_PD1 may overlap the electrically-connected first blue light-emitting element B_ED1. The first green driving circuit G1_PD1 may overlap the electrically-connected first green light-emitting element G1_ED1. The second green driving circuit G2_PD1 may overlap the electrically-connected second green light-emitting element G2_ED1.

The second display area DA2 may include first and second sub areas SDA1 and SDA2. In an embodiment of the invention, the second display area DA2 illustrated in FIG. 6 may include the first edge area DA2_E1 and the third corner area DA2_C3. Hereinafter, for convenience of description, it is described that the first and second sub areas SDA1 and SDA2 are included in the second display area DA2 that is an upper concept.

A plurality of second reference units RU2 is repeatedly disposed in the second direction DR2 in the second display area DA2 of the display panel DP. Although not shown, the second reference units RU2 may be repeatedly disposed in the first direction DR1 in the second display area DA2. The pixels included in each of the second reference units RU2 may be also referred to as "second pixels PX2". For convenience of description, a red pixel of the second pixels PX2 is also referred to as a "second red pixel PXR2", and a blue pixel of the second pixels PX2 is also referred to as a "second blue pixel PXB2". Moreover, among the second pixels PX2, a green pixel adjacent to the second red pixel PXR2 is also referred to as a "third green pixel PXG3", and a green pixel adjacent to the second blue pixel PXB2 is also referred to as a "fourth green pixel PXG4".

Each of the second pixels PX2 includes second light-emitting elements (R_ED21, R_ED22, B_ED21, B_ED22, G1_ED21, G1_ED22, G2_ED21, G2_ED22) and second driving circuits (R_PD2, B_PD2, G1_PD2, G2_PD2) electrically connected to the second light-emitting elements (R_ED21, R_ED22, B_ED21, B_ED22, G1_ED21, G1_ED22, G2_ED21, G2_ED22). In an embodiment of the invention, the second light-emitting elements (R_ED21, R_ED22, B_ED21, B_ED22, G1_ED21, G1_ED22, G2_ED21, G2_ED22) include the second red light-emitting elements R_ED21 and R_ED22, the second blue light-emitting elements B_ED21 and B_ED22, the third green light-emitting elements G1_ED21 and G1_ED22, and the fourth green light-emitting elements G2_ED21 and G2_ED22. The second driving circuits (R_PD2, B_PD2, G1_PD2, G2_PD2) include the second red driving circuit R_PD2, the second blue driving circuit B_PD2, the second green driving circuit G1_PD2, and the third green driving circuit G2_PD2.

Each of the second reference units RU2 may include 'x' second red light-emitting elements (R_ED21, R_ED22), 'y' green light-emitting elements (G1_ED21, G1_ED22, G2_ED21, G2_ED22), and 'x' second blue light-emitting elements (B_ED21, B_ED22). Here, each of 'x' and 'y' is a natural number greater than or equal to 1, and 'y' may be greater than 'x'. In an embodiment of the invention, 'y' may be '2x'. In an embodiment of the invention, 'x' is 2 and 'y' is 4.

The second red pixel PXR2 may include the two second red light-emitting elements R_ED21 and R_ED22, and the second blue pixel PXB2 may include the two second blue light-emitting elements B_ED21 and B_ED22. Some parts of the four green light-emitting elements, for example, two green light-emitting elements (hereinafter referred to as the third green light-emitting elements (G1_ED21, G1_ED22)), may be included in the third green pixel PXG3. The remaining part of the four green light-emitting elements, for example, two green light-emitting elements (hereinafter referred to as the fourth green light-emitting elements (G2_ED21, G2_ED22)), may be included in the fourth green pixel PXG4.

Each of the second red light-emitting elements R_ED21 and R_ED22 outputs red light, and each of the second blue light-emitting elements B_ED21 and B_ED22 outputs blue light. Each of the third green light-emitting elements G1_ED21 and G1_ED22 outputs green light, and each of the fourth green light-emitting elements G2_ED21 and G2_ED22 outputs green light.

Each of light-emitting reference units LRU may include a plurality of light-emitting elements included in each of the second reference units RU2. In an embodiment of the invention, each of the light-emitting reference units LRU may include the two second red light-emitting elements R_ED21 and R_ED22, the two second blue light-emitting elements B_ED21 and B_ED22, the two third green light-emitting elements G1_ED21 and G1_ED22, and the two fourth green light-emitting elements G2_ED21 and G2_ED22.

The second red pixel PXR2 further includes a second red driving circuit R_PD2. The second red driving circuit R_PD2 may be electrically connected to the corresponding 'x' second red light-emitting elements (R_ED21, R_ED22) so as to simultaneously control the driving of the 'x' second red light-emitting elements (R_ED21, R_ED22). The third green pixel PXG3 further includes a second green driving circuit G1_PD2. The second green driving circuit G1_PD2 may be electrically connected to the corresponding 'x' third green light-emitting elements (G1_ED21, G1_ED22) so as to simultaneously control the driving of the 'x' third green light-emitting elements (G1_ED21, G1_ED22). The fourth green pixel PXG4 further includes a third green driving circuit G2_PD2. The third green driving circuit G2_PD2 may be electrically connected to the corresponding 'x' fourth green light-emitting elements (G2_ED21, G2_ED22) so as to simultaneously control the driving of the 'x' fourth green light-emitting elements (G2_ED21, G2_ED22). The second blue pixel PXB2 further includes the second blue driving circuit B_PD2. The second blue driving circuit B_PD2 may be electrically connected to the corresponding 'x' second blue light-emitting elements (B_ED21, B_ED22) so as to simultaneously control the driving of the 'x' second blue light-emitting elements (B_ED21, B_ED22).

Each of driving reference units DRU may include 'k' driving circuits included in each of the second reference units RU2. Here, 'k' may be a natural number greater than or equal to 1. In an embodiment, the number (e.g., 2x+y) of light-emitting elements included in each of the second reference units RU2 may be greater than 'k'. In an embodiment, "2x+y" may be a multiple of 'k', a multiple of 3, or a multiple of '4'. In an embodiment of the invention, each of the second reference units RU2 further includes dummy light-emitting elements. The number of light-emitting elements included in each of the second reference units RU2 may be greater than the number of driving circuits.

In an embodiment of the invention, each of the driving reference units DRU may include the second red driving circuit R_PD2, the second green driving circuit G1_PD2, the third green driving circuit G2_PD2, and the second blue driving circuit B_PD2.

In an embodiment of the invention, 'x' may be 2 and 'y' may be 4, but is not limited thereto. Furthermore, in an embodiment, 'p' may be the same value as 'x', and 'q' may be the same value as 'y', but are not particularly limited thereto.

Each of the second red light-emitting elements R_ED21 and R_ED22 may have the same shape and the same size as those of the first red light-emitting element R_ED1. Each of the third green light-emitting elements G1_ED21 and G1_ED22 may have the same shape and the same size as those of the first green light-emitting element G1_ED1, and/or each of the fourth green light-emitting elements G2_ED21 and G2_ED22 may have the same shape and the same size as those of the second green light-emitting element G2_ED1. Each of the second blue light-emitting elements B_ED21 and B_ED22 may have the same shape and the same size as those of the first blue light-emitting element B_ED1.

The second display area DA2 may include the first sub area SDA1 and the second sub area SDA2. In detail, the first edge area DA2_E1 and the third corner area DA2_C3 of the second display area DA2 may be divided into the first sub area SDA1 and the second sub area SDA2, respectively. Although not shown in FIG. 6, the first corner area DA2_C1, the second corner area DA2_C2, the fourth corner area DA2_C4, and the second edge area DA2_E2 of the second display area DA2 may be divided into the first sub area SDA1 and the second sub area SDA2. The first sub area SDA1 may be disposed between the second sub area SDA2 and the first display area DA1.

FIG. 6 illustrates the area AA including an area that is spaced in the first direction DR1 between the first edge gate block GDB1_E and the second corner gate block GDB1_C2 shown in FIG. 5. Accordingly, the first gate driving block GDB1 is not shown in the second sub area SDA2 and the non-display area NDA, and only first to sixth sub voltage lines RVL1_a to RVL2_c are shown in the second sub area SDA2. However, a portion of the first gate driving block GDB1 disposed in the second display area DA2 may be disposed in the second sub area SDA2. The driving reference units DRU may be disposed in the first sub area SDA1. The driving reference units DRU do not overlap the first gate driving block GDB1 in a plan view. In detail, the first edge gate block GDB1_E may be disposed in the non-display area NDA and the second sub area SDA2 of the first edge area DA2_E1. The first corner gate block GDB1_C1 may be disposed in the non-display area NDA and the second sub area SDA2 of the first corner area DA2_C1. The second corner gate block GDB1_C2 may be disposed in the non-display area NDA and the second sub area SDA2 of the third corner area DA2_C3. The second gate driving block GDB2 may also be disposed in a similar manner. A portion of the second gate driving block GDB2 may be disposed in the second sub area SDA2 of the second display area DA2. The driving reference units DRU may be disposed in the first sub area SDA1.

The light-emitting elements included in each of the second reference units RU2 are disposed in the first and second sub areas SDA1 and SDA2. Some of the light-emitting reference units LRU overlap the first sub area SDA1. The rest of the light-emitting reference units LRU overlap the second sub area SDA2. Hereinafter, some parts of the light-emitting reference units LRU overlapping the first sub area SDA1 is also referred to as "first light-emitting reference units". The remaining part of light-emitting reference units LRU overlapping the second sub area SDA2 is also referred to as "second light-emitting reference units".

The first light-emitting reference units are disposed on the driving reference units DRU. The second light-emitting reference units are disposed on the first gate driving block GDB1 (or the second gate driving block GDB2). Accordingly, the second light-emitting reference units may not overlap the corresponding driving reference units DRU thus electrically connected.

The first to sixth sub voltage lines (RVL1_a, RVL2_a, RVL1_b, RVL2_b, RVL1_c, RVL2_c) may be disposed in the non-display area NDA. In an embodiment of the invention, the first to sixth sub voltage lines (RVL1_a, RVL2_a, RVL1_b, RVL2_b, RVL1_c, RVL2_c) may extend in the first direction DR1 in the display panel DP.

Figure 7A:
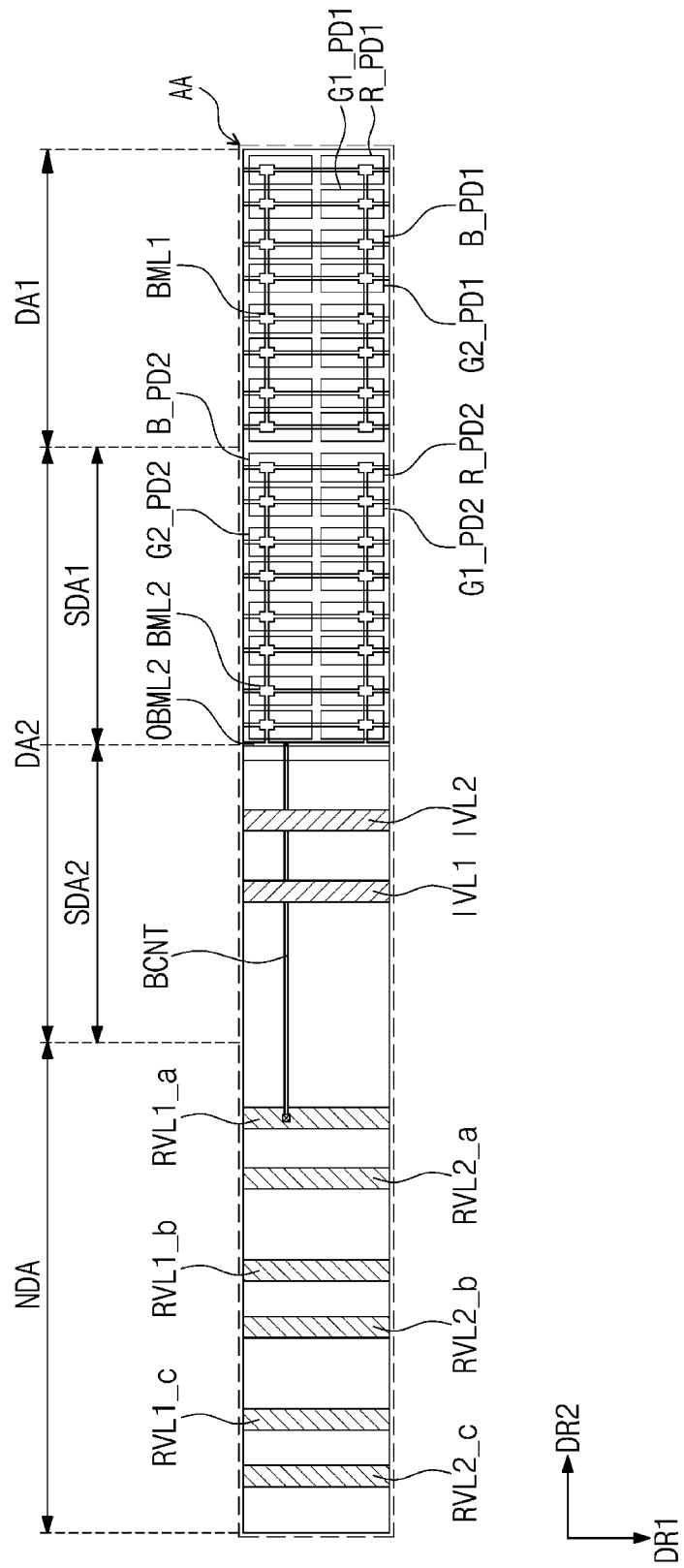
FIGS. 7A and 7B are plan views illustrating a second shielding layer connected to a first reference voltage line disposed in the area AA shown in FIG. 5.
Figure 7B:
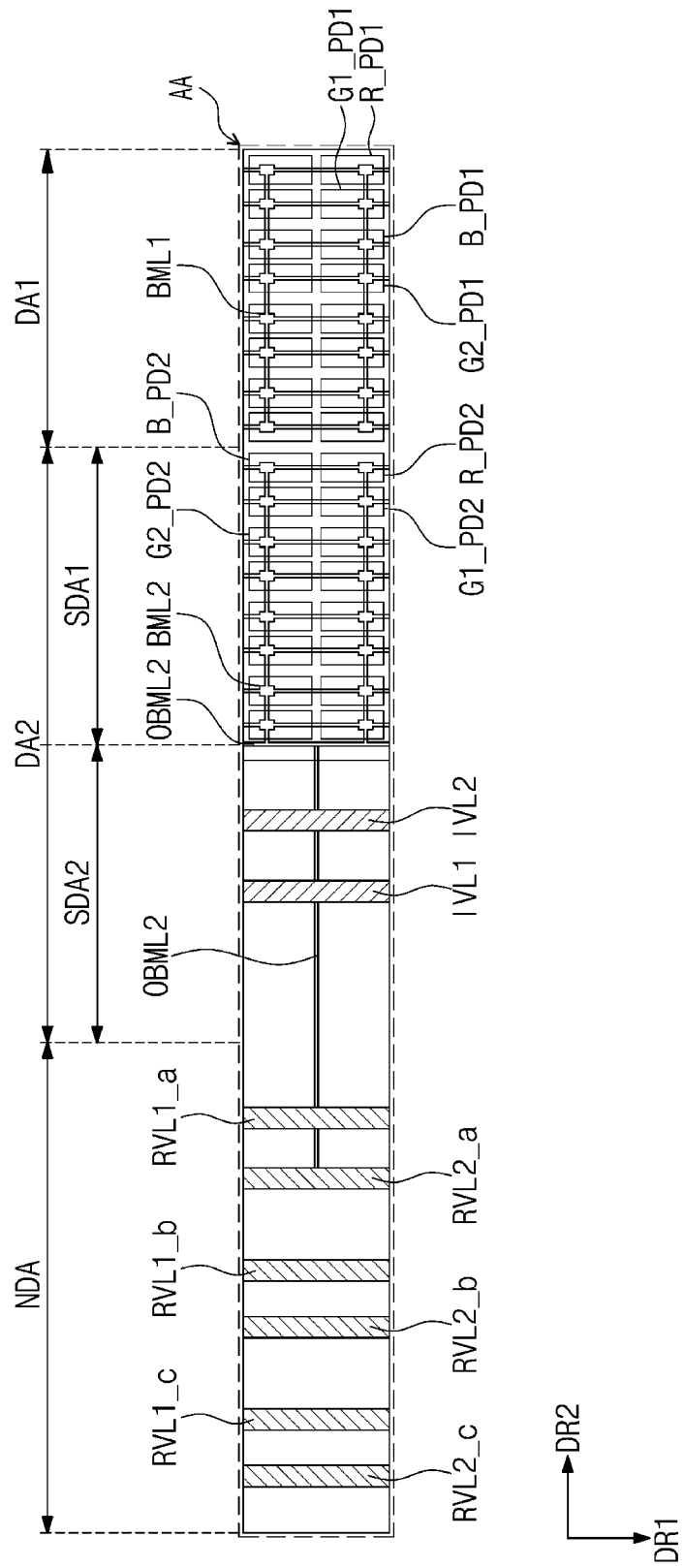

FIGS. 7A and 7B are plan views illustrating a second shielding layer connected to a first reference voltage line disposed in the area AA shown in FIG. 5. Below, components that are the same as the components described with reference to FIGS. 5 and 6 are marked by the same reference numerals, and thus, additional description will be omitted to avoid redundancy. Moreover, for convenience of description, the first red pixel PXR1, the first blue pixel PXB1, the first green pixel PXG1, and the second green pixel PXG2 disposed in the first display area DA1 are also referred to as the "first pixels PX1" that is an upper concept. The second red pixel PXR2, the second blue pixel PXB2, the third green pixel PXG3, and the fourth green pixel PXG4 disposed in the second display area DA2 are also referred to as the "second pixels PX2" that is an upper concept.

Referring to FIGS. 6 and 7A, each of the first pixels PX1 includes first shielding layers BML1. Each of the first driving circuits R_PD1, G1_PD1, G2_PD1, and B_PD1 included in the first pixels PX1 may include a plurality of driving transistors. Each of the first shielding layers BML1 corresponds to one (e.g., a first driving transistor T1 (refer to FIG. 10A)) of the plurality of driving transistors. The first shielding layers BML1 are electrically connected to one another and may be formed or provided in a mesh shape. In an embodiment of the invention, the display panel DP (refer to FIG. 11) may further include first outer lines (OBML1, refer to FIG. 11). The first shielding layers BML1 may be electrically connected to the first outer lines OBML1. In an embodiment of the invention, the first shielding layers BML1 and the first outer lines OBML1 may be integrated with each other.

Each of the second pixels PX2 includes second shielding layers BML2. Each of the second driving circuits R_PD2, B_PD2, G1_PD2, and G2_PD2 included in the second pixels PX2 may include a plurality of driving transistors. Each of the second shielding layers BML2 corresponds to one (e.g., a second driving transistor T1' (refer to FIG. 10B)) of the plurality of driving transistors. The second shielding layers BML2 are electrically connected to one another and may be formed or provided in a mesh shape. In an embodiment of the invention, the display panel DP may further include a second outer line OBML2. The second outer line OBML2 may have a shape extending in the first direction DR1. The plurality of second shielding layers BML2 may be electrically connected to the second outer line OBML2. In an embodiment of the invention, the second shielding layers BML2 and the second outer line OBML2 may be integrated with each other. In an embodiment of the invention, the first shielding layers BML1 and the second shielding layers BML2 may be spaced apart from each other and may be electrically insulated from each other.

A first initialization voltage line IVL1 and a second initialization voltage line IVL2 may be disposed in the second sub area SDA2. In an embodiment of the invention, the first initialization voltage line IVL1 and the second initialization voltage line IVL2 may extend in the first direction DR1 within the display panel DP. The voltage generation block VGB (refer to FIG. 3) applies the first initialization voltage VINT (refer to FIG. 3) to the display panel DP through the first initialization voltage line IVL1. The voltage generation block VGB applies the second initialization voltage VAINT to the display panel DP through the second initialization voltage line IVL2.

In an embodiment of the invention, the second shielding layers BML2 may be electrically connected to the first sub voltage line RVL1_a through a shielding connection electrode BCNT. Accordingly, the first gate driving voltage VGL may be applied to the second shielding layers BML2. In an embodiment of the invention, the second outer line OBML2 may be electrically connected to the first sub voltage line RVL1_a through the shielding connection electrode BCNT. The first gate driving voltage VGL may be applied to the second shielding layers BML2 through the second outer line OBML2. However, the invention is not limited thereto. In an embodiment, the second outer line OBML2 may further include a portion extending in the second direction DR2. The second shielding layers BML2 may be electrically connected to the first sub voltage line RVL1_a through the second outer line OBML2 extending in the second direction DR2.

Referring to FIG. 7B, the second shielding layers BML2 may be electrically connected to the second sub voltage line RVL2_a through a portion of the second outer line OBML2 that extends in the second direction DR2. Accordingly, the second gate driving voltage VGH may be applied to the second shielding layers BML2. However, the invention is not limited thereto. In an embodiment, the second shielding layers BML2 may be electrically connected to the second sub voltage line RVL2_a through a separate connection electrode, not the second outer line OBML2, for example.

Figure 8:
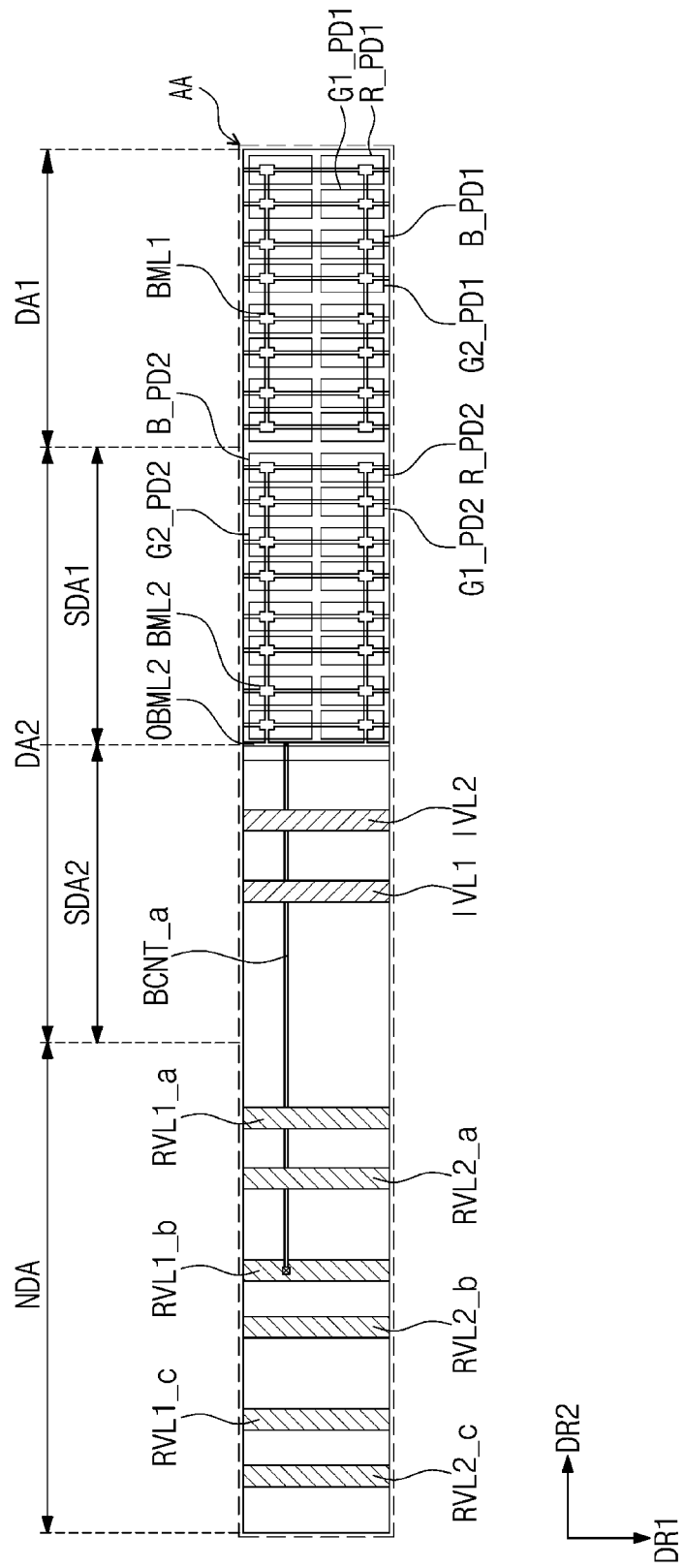
FIG. 8 is a plan view illustrating a second shielding layer connected to a second reference voltage line disposed in the area AA shown in FIG. 5.
Figure 9:
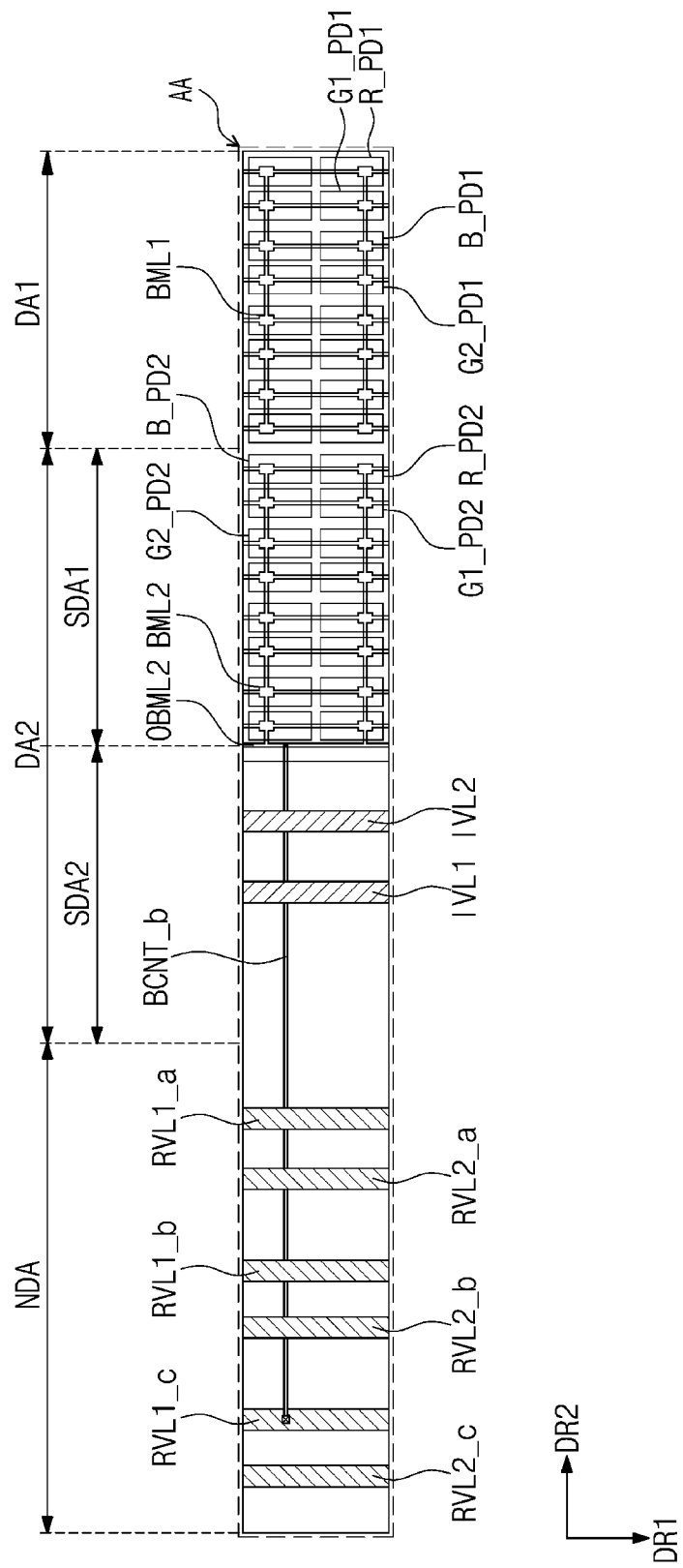
FIG. 9 is a plan view illustrating a second shielding layer connected to a third reference voltage line disposed in the area AA shown in FIG. 5.

FIG. 8 is a plan view illustrating a second shielding layer connected to a second reference voltage line disposed in the area AA shown in FIG. 5. FIG. 9 is a plan view illustrating a second shielding layer connected to a third reference voltage line disposed in the area AA shown in FIG. 5. Hereinafter, components that are the same as the components described with reference to FIGS. 7A and 7B are marked by the same reference numerals, and thus, additional description will be omitted to avoid redundancy.

Referring to FIG. 8, the second shielding layers BML2 may be electrically connected to the third sub voltage line RVL1_b through a shielding connection electrode BCNT_a. Accordingly, the first gate driving voltage VGL may be applied to the second shielding layers BML2. In an embodiment of the invention, the second outer line OBML2 may be electrically connected to the third sub voltage line RVL1_b through the shielding connection electrode BCNT_a. The first gate driving voltage VGL (refer to FIG. 4) may be applied to the second shielding layers BML2 through the second outer line OBML2. However, the invention is not limited thereto. In an embodiment, the second outer line OBML2 may further include a portion extending in the second direction DR2, for example. The second shielding layers BML2 may be electrically connected to the third sub voltage line RVL1_b through the second outer line OBML2 extending in the second direction DR2. Although not illustrated, the second shielding layers BML2 are electrically connected to the fourth sub voltage line RVL2_b through a portion of the second outer line OBML2 that extends in the second direction DR2. The second gate driving voltage VGH may be applied to the second shielding layers BML2.

Referring to FIG. 9, the second shielding layers BML2 may be electrically connected to the fifth sub voltage line RVL1_c through a shielding connection electrode BCNT_b. Accordingly, the first gate driving voltage VGL (refer to FIG. 4) may be applied to the second shielding layers BML2. In an embodiment of the invention, the second outer line OBML2 may be electrically connected to the fifth sub voltage line RVL1_c through the shielding connection electrode BCNT_b. The first gate driving voltage VGL may be applied to the second shielding layers BML2 through the second outer line OBML2. However, the invention is not limited thereto. In an embodiment, the second outer line OBML2 may further include a portion extending in the second direction DR2, for example. The second shielding layers BML2 may be electrically connected to the fifth sub voltage line RVL1_c through the second outer line OBML2 extending in the second direction DR2. Although not illustrated, the second shielding layers BML2 are electrically connected to the sixth sub voltage line RVL2_c through a portion of the second outer line OBML2 that extends in the second direction DR2. The second gate driving voltage VGH may be applied to the second shielding layers BML2.

Figure 10A:
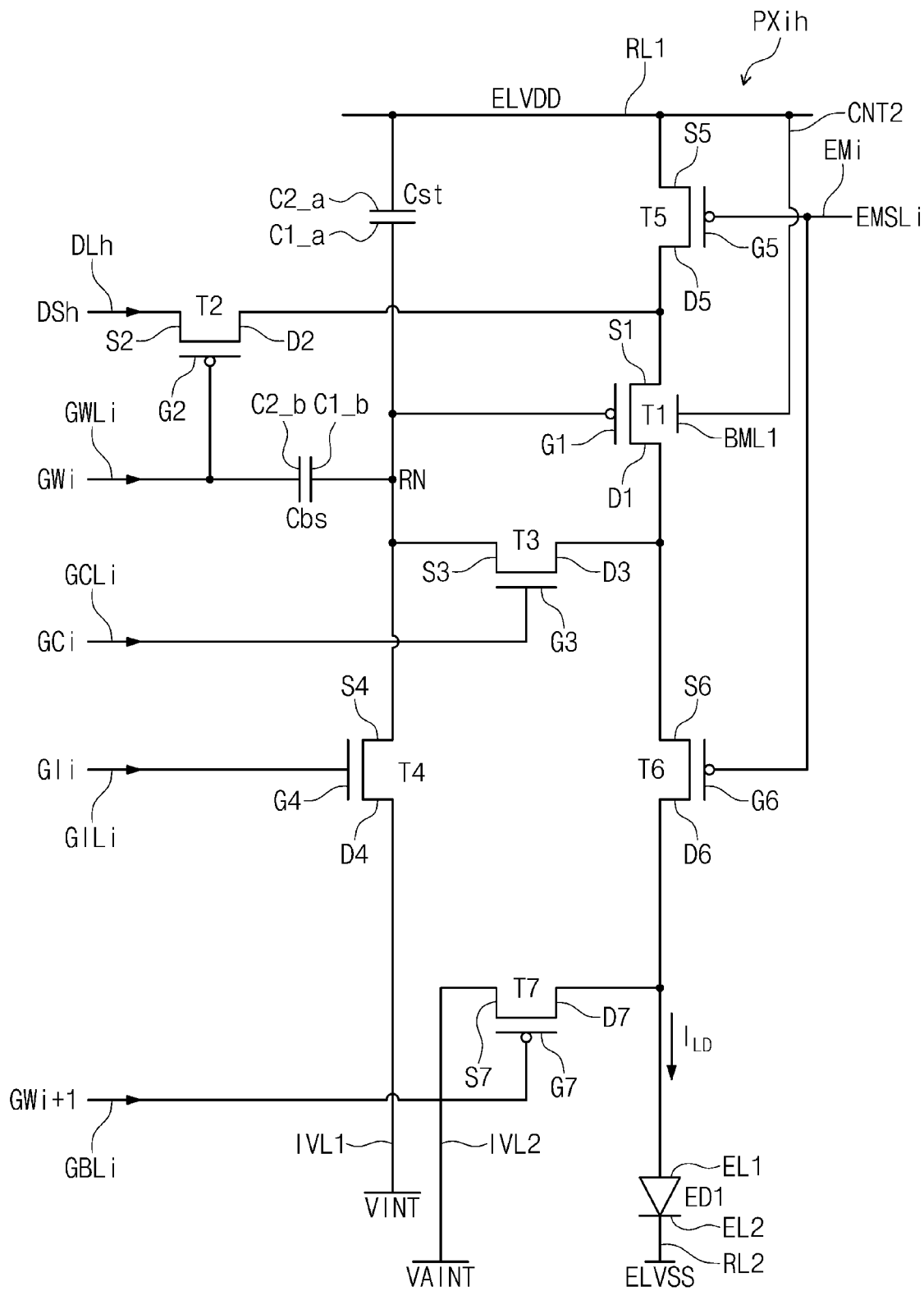
FIG. 10A is a circuit diagram of an embodiment of a first pixel disposed in a first display area, according to the invention.
Figure 10B:
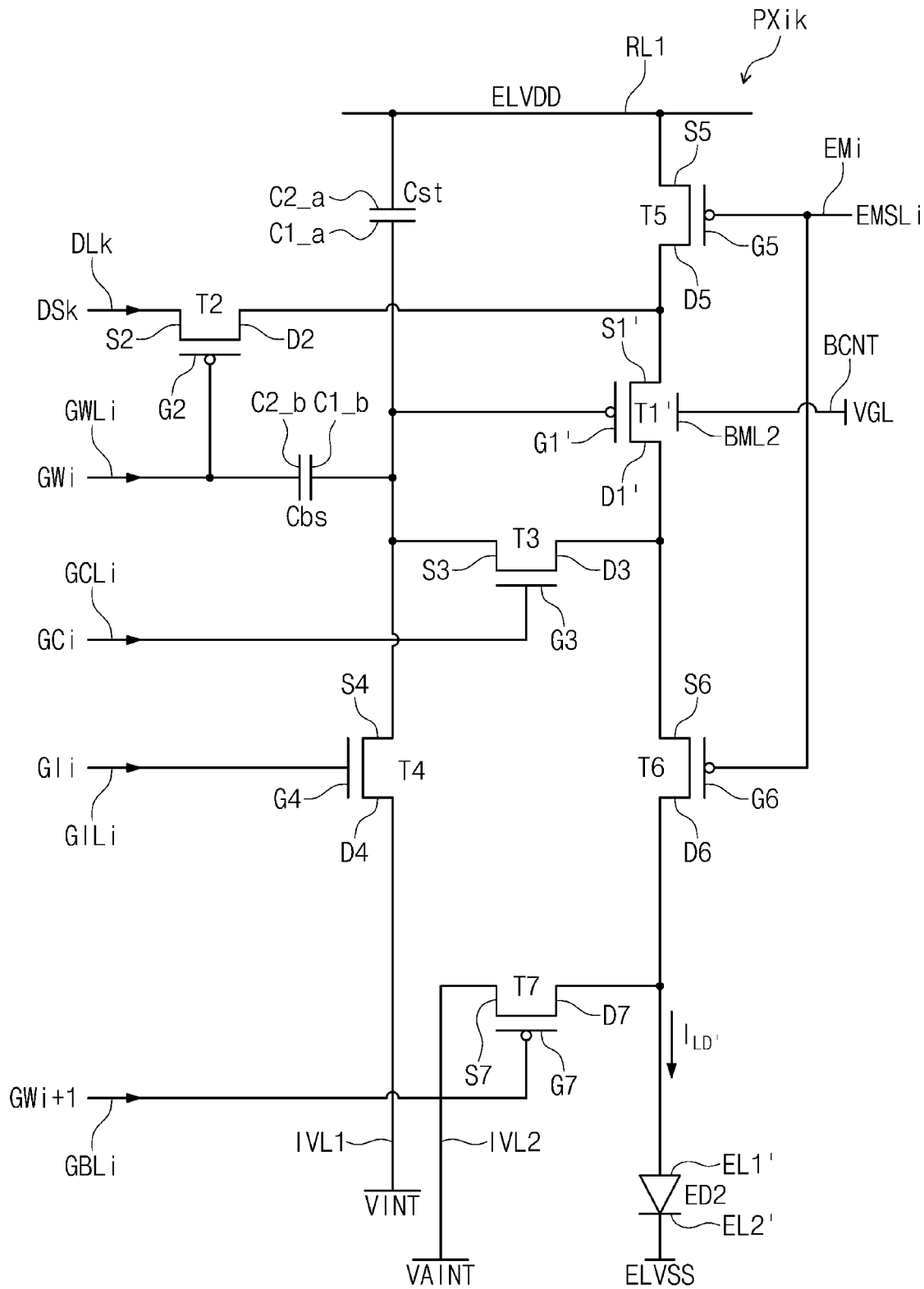
FIG. 10B is a circuit diagram of an embodiment of a second pixel disposed in a second display area, according to the invention.

FIG. 10A is a circuit diagram of an embodiment of a first pixel disposed in a first display area, according to the invention. FIG. 10B is a circuit diagram of an embodiment of a second pixel disposed in a second display area, according to the invention.

Referring to FIGS. 3 and 10A, a pixel PXij, which is connected to the i-th scan line GWLi of the scan lines GWL1 to GWLn and which is connected to the j-th data line DLj of the data lines DL1 to DLm, from among the first pixels PX1 disposed in the first display area DA1 (refer to FIG. 5), is shown. Here, i is a natural number equal to or less than n, and j is a natural number equal to or less than m.

In an embodiment of the invention, the pixel PXij may include first to seventh transistors T1 to T7, a first capacitor Cst, a second capacitor Cbs, and a first light-emitting element ED1. The first light-emitting element ED1 included in the pixel PXij may be one of the light-emitting elements R_ED1, G1_ED1, G2_ED2, and B_ED1 illustrated in FIG. 6. Some of the first to seventh transistors T1 to T7 may be provided as N-type transistors (n-channel metal-oxide-semiconductor field-effect transistor ("MOSFET")), and the rest may be provided as P-type transistors (p-channel MOSFET). In an embodiment, it is described that, among the first to seventh transistors T1 to T7, each of the third transistor T3 and the fourth transistor T4 is provided as a N-type transistor, and each of the remaining transistors T1, T2, T5, T6, and T7 is in a P-type transistor. However, the invention is not limited thereto. In an embodiment, among the first to seventh transistors T1 to T7, the third transistor T3, the fourth transistor T4, and the seventh transistor T7 may be provided as N-type transistors, and the remaining transistors T1, T2, T5, and T6 may be provided as N-type transistors. In an alternative embodiment, only one of the first to seventh transistors T1 to T7 may be provided as an N-type transistor, and the remaining transistors may be provided as P-type transistors. In an alternative embodiment, all of the first to seventh transistors T1 to T7 may be provided as N-type transistors, or all of the first to seventh transistors T1 to T7 may be provided as P-type transistors. Also, the number of transistors included in the pixel PXij is not limited thereto. That is, at least one of the first to seventh transistors T1 to T7 may be omitted. In another embodiment, one or more transistors may be added to the pixel PXij.

Besides, at least one of the first to seventh transistors T1, T2, T3, T4, T5, T6, and T7 may be a transistor having a low-temperature polycrystalline silicon ("LTPS") semiconductor layer. At least one of the first to seventh transistors T1, T2, T3, T4, T5, T6, and T7 may be a transistor having an oxide semiconductor layer. In an embodiment of the invention, the third and fourth transistors T3 and T4 may be transistors having an oxide semiconductor layer. The first, second, fifth, sixth, and seventh transistors T1, T2, T5, T6, and T7 may be transistors having a LTPS semiconductor layer.

In this specification, "a transistor is connected to a signal line" means that one of a source electrode, a drain electrode, and a gate electrode of the transistor is integrated with the signal line or is connected to the signal line through a connection electrode. Also, "a transistor is electrically connected to another transistor" means that one of a source electrode, an electrode, and a gate electrode of the transistor is integrated with one of a source electrode, a drain electrode, and a gate electrode of the other transistor, or is connected to the other transistor through a connection electrode".

Hereinafter, each of the first to seventh transistors T1 to T7 includes a first electrode, a second electrode, and a gate electrode (also referred to as control electrode). The first electrode is referred to as a "source electrode". The second electrode is referred to as a "drain electrode". However, the invention is not limited thereto, and in another embodiment, the first electrode may be referred to as a "drain electrode" and the second electrode is referred to as a "source electrode".

The first capacitor Cst is connected between a reference node RN and a first power supply line RL1 receiving the first power supply voltage ELVDD. The first capacitor Cst includes a first electrode C1_a connected to the reference node RN and a second electrode C2_a connected to a first power supply line RL1.

The first transistor T1 is connected between the first power supply line RL1 and the first light-emitting element ED1. A source electrode S1 of the first transistor T1 is electrically connected to the first power supply line RL1. A drain electrode D1 of the first transistor T1 is electrically connected to a first electrode EL1 of the first light-emitting element ED1. A gate electrode G1 of the first transistor T1 is electrically connected to the reference node RN. Hereinafter, for convenience of description, the first transistor T1 is also referred to as the "first driving transistor T1".

The second transistor T2 is connected between the j-th data line DLj and the source electrode S1 of the first driving transistor T1. A source electrode S2 of the second transistor T2 is electrically connected to the j-th data line DLj. A drain electrode D2 of the second transistor T2 is electrically connected to the source electrode S1 of the first driving transistor T1. In an embodiment, a gate electrode G2 of the second transistor T2 is electrically connected to the i-th scan line GWLi. In an embodiment of the invention, the i-th scan signal GWi may be delivered to the gate electrode G2 of the second transistor T2 through the i-th scan line GWLi. A data signal DSj may be delivered to the drain electrode D2 of the second transistor T2 through the j-th data line DLj.

The third transistor T3 is connected between the reference node RN and the drain electrode D1 of the first driving transistor T1. A source electrode S3 of the third transistor T3 is electrically connected to the reference node RN. A drain electrode D3 of the third transistor T3 is electrically connected to the drain electrode D1 of the first driving transistor T1. A gate electrode G3 of the third transistor T3 is electrically connected to the i-th compensation line GCLi. In an embodiment of the invention, an i-th compensation scan signal GCi may be delivered to the gate electrode G3 of the third transistor T3 through the i-th compensation line GCLi.

The fourth transistor T4 is connected between the gate electrode G1 of the first driving transistor T1 and the first initialization line IVL1. A source electrode S4 of the fourth transistor T4 is electrically connected to the gate electrode G1 of the first driving transistor T1. A drain electrode D4 of the fourth transistor T4 is electrically connected to the first initialization line IVL1. A gate electrode G4 of the fourth transistor T4 may be electrically connected to the i-th initialization line GILI. In an embodiment of the invention, an i-th initialization scan signal GIi may be delivered to the gate electrode G4 of the fourth transistor T4 through the i-th initialization line GILI.

In an embodiment, each of the third transistor T3 and the fourth transistor T4 may include a plurality of gate electrodes. Each of the third and fourth transistors T3 and T4 has a plurality of gate electrodes, thereby reducing a leakage current of the pixel PXij.

The fifth transistor T5 is connected between the first power supply line RL1 and the source electrode S1 of the first driving transistor T1. A source electrode S5 of the fifth transistor T5 is electrically connected to the first power supply line RL1. A drain electrode D5 of the fifth transistor T5 is electrically connected to the source electrode S1 of the first driving transistor T1. In an embodiment, a gate electrode G5 of the fifth transistor T5 may be electrically connected to the i-th emission line EMSLi.

The sixth transistor T6 is connected between the drain electrode D1 of the first driving transistor T1 and the first light-emitting element ED1. A source electrode S6 of the sixth transistor T6 is electrically connected to the drain electrode D1 of the first driving transistor T1. A drain electrode D6 of the sixth transistor T6 is electrically connected to the first electrode EL1 of the first light-emitting element ED1. A gate electrode G6 of the sixth transistor T6 may be electrically connected to the i-th emission line EMSLi. In an embodiment of the invention, an i-th emission signal EMi may be delivered to the gate electrode G5 of the fifth transistor T5 and the gate electrode G6 of the sixth transistor T6 through the i-th emission line EMSLi.

The seventh transistor T7 is connected between the first electrode EL1 of the first light-emitting element ED1 and the second initialization voltage line IVL2. A source electrode S7 of the seventh transistor T7 is electrically connected to the second initialization voltage line IVL2. A drain electrode D7 of the seventh transistor T7 is electrically connected to the first electrode EL1 of the first light-emitting element ED1. A gate electrode G7 of the seventh transistor T7 may be electrically connected to the i-th emission initialization line GBLi. The i-th emission initialization signal GWi+1 may be delivered to the gate electrode G7 of the seventh transistor T7 through the i-th emission initialization line GBLi. In an embodiment of the invention, the i-th emission initialization signal GWi+1 may be the same signal as the (i+1)-th scan signal delivered to the (i+1)-th scan line.

The second capacitor Cbs is connected between the i-th scan line GWLi and the reference node RN. The second capacitor Cbs includes a first electrode C1_b connected to the reference node RN and a second electrode C2_b connected to the i-th scan line GWLi.

The first light-emitting element ED1 is connected between the first driving transistor T1 and a second power supply line RL2 receiving the second power supply voltage ELVSS. The first electrode EL1 of the first light-emitting element ED1 is electrically connected to the drain electrode D1 of the first driving transistor T1. A second electrode EL2 of the first light-emitting element ED1 is electrically connected to the second power supply line RL2. In an embodiment of the invention, the sixth transistor T6 may be connected between the drain electrode D1 of the first transistor T1 and the first electrode EL1 of the first light-emitting element ED1.

Referring to FIGS. 4 and 10A, the gate driving block GDB sequentially transmits the scan signals GW1 to GWn, the initialization scan signals GI1 to GIn, the compensation scan signals GC1 to GCn, and the emission signals EM1 to EMn to the display panel DP. Each of the scan signals GW1 to GWn, the initialization scan signals GI1 to GIn, the compensation scan signals GC1 to GCn, and the emission signals EM1 to EMn may have a high level during some sections and may have a low level during some sections. At this time, when the corresponding signal has a high level, N-type transistors are turned on. When the corresponding signal has a low level, P-type transistors are turned on. Hereinafter, the pixel PXij including the N-type third and fourth transistors T3 and T4 and the P-type first, second, fifth, sixth, and seventh transistors T1, T2, T5, T6, and T7, which are described with reference to FIG. 10A, is described mainly.

When the i-th initialization scan signal GIi has a high level, the fourth transistor T4 is turned on. When the fourth transistor T4 is turned on, the first initialization voltage VINT is delivered to the reference node RN through the fourth transistor T4. Accordingly, the reference node RN is initialized to the first initialization voltage VINT. The gate electrode G1 of the first driving transistor T1 electrically connected to the reference node RN is initialized to the first initialization voltage VINT.

When the i-th compensation scan signal GCi has a high level, the third transistor T3 is turned on. When the third transistor T3 is turned-on, the first driving transistor T1 is diode-connected by the third transistor T3 thus turned on and is forward-biased.

Afterward, the i-th initialization scan signal GIi may have a low level and thus the fourth transistor T4 may be turned off. Afterward, the i-th scan signal GWi may have a low level. When the i-th scan signal GWi has a low level, the second transistor T2 is turned on. When the second transistor T2 is turned on, the data signal DSj is applied to the source electrode S1 of the first driving transistor T1 through the second transistor T2.

In this case, a compensation voltage "DS-|Vth|" reduced by a level of a threshold voltage Vth of the first driving transistor T1 from a potential included in the data signal DSj applied to the source electrode S1 of the first driving transistor T1 is applied to the drain electrode D1 and the gate electrode G1 of the first driving transistor T1. At this time, the first power supply voltage ELVDD and the compensation voltage "DS-|Vth|" may be applied to opposite ends of the first capacitor Cst, respectively. The first capacitor Cst may store a charge corresponding to a voltage difference between the opposite ends "ELVDD-(DS-|Vth|)".

The potential included in the i-th scan signal GWi and a potential of the reference node RN are applied to opposite ends of the second capacitor Cbs. The second capacitor Cbs may store charges corresponding to a voltage difference between the opposite ends.

The i-th scan signal GWi has a high level and thus the second transistor T2 is turned off, and the i-th compensation scan signal GCi has a low level and thus the third transistor T3 is turned off. Afterward, the i-th emission signal EMi may have a low level. When the i-th emission signal EMi has a low level, the fifth and sixth transistors T5 and T6 are turned on. When the fifth and sixth transistors T5 and T6 are turned on, the first power supply voltage ELVDD is applied to the source electrode S1 of the first driving transistor T1. A driving current $I_{LD}$ according to a difference between a potential of the source electrode S1 and a potential of the gate electrode G1 of the first driving transistor T1 is generated through the first driving transistor T1. The driving current $I_{LD}$ is delivered to the first light-emitting element ED1 through the sixth transistor T6. The first light-emitting element ED1 receives a driving current $I_{LD}$ and emits light.

At this time, during a section where the fifth and sixth transistors T5 and T6 are turned on, a potential of the gate electrode G1 of the first driving transistor T1 that causes the first driving transistor T1 to be turned on may be maintained through charge stored in the first capacitor Cst. Furthermore, even though the i-th compensation scan signal GCi and the i-th initialization scan signal GIi for maintaining turn-off states of the third and fourth transistors T3 and T4 have low levels, it is possible to prevent a potential of the gate electrode G1 of the first driving transistor T1 from being lowered through a coupling effect of the second capacitor Cbs connected to the i-th scan signal GWi. Accordingly, it is possible to prevent deterioration of the display quality of the display device DD (refer to FIG. 1) when the image IM (refer to FIG. 1) including black is displayed.

In an embodiment of the invention, the pixel PXij may include the first shielding layer BML1. The first shielding layer BML1 may correspond to the first driving transistor T1. The first shielding layer BML1 may receive a first common voltage through a second connection electrode CNT2. In an embodiment of the invention, the first common voltage may be the first power supply voltage ELVDD. The first shielding layer BML1 may receive the first power supply voltage ELVDD through the second connection electrode CNT2. The first shielding layer BML1 may block an electric potential, which is caused by the polarization of a base layer BL (refer to FIG. 12) generated because the type (P-type) of the first driving transistor T1 is different from the types (N-type) of the third and fourth transistors T3 and T4, from affecting the first driving transistor T1. In detail, referring to FIGS. 10A and 12, when the first, fifth, and sixth transistors T1, T5, and T6 are turned on and thus the driving current $I_{LD}$ flows to the first light-emitting element ED1, the third and fourth transistors T3 and T4 are turned off. To turn off the third and fourth transistors T3 and T4, the i-th compensation scan signal GCi and the i-th initialization scan signal GIi have a low level. By the i-th compensation scan signal GCi and the i-th initialization scan signal GIi having a low level, positive charges may be relatively concentrated in an area adjacent to the third and fourth transistors T3 and T4 on the base layer BL, and negative charges may be relatively concentrated in an area adjacent to the first transistor T1 on the base layer BL. In this case, electrical characteristics of the first transistor T1 may be deteriorated due to the negative charges concentrated in an area adjacent to the first transistor T1 on the base layer BL. At this time, when the first power supply voltage ELVDD having a positive electric potential is applied to the first shielding layer BML1, concentration of negative charges in an area adjacent to the first transistor T1 on the base layer BL may be prevented by the third and fourth transistors T3 and T4, and electrical characteristics of the first transistor T1 may be prevented from being deteriorated. In an embodiment of the invention, when the first power supply voltage ELVDD is applied to the first shielding layer BML1, the polarization of the base layer BL may be effectively prevented as compared to a case that the first shielding layer BML1 is in a floating state.

Furthermore, when the driving current $I_{LD}$ flows through the first driving transistor T1, the potential of the source electrode S1 of the first driving transistor T1 is the same as the potential of the first shielding layer BML1, thereby minimizing the influence of the first shielding layer BML1 on the driving current $I_{LD}$ flowing into the first driving transistor T1.

Referring to FIG. 10B, a pixel PXih, which is connected to the i-th scan line GWLi of the scan lines GWL1 to GWLn, from among the second pixels PX2 disposed in the second display area DA2 (refer to FIG. 5) and which is connected to the h-th data line DLh of the data lines DL1 to DLm (i.e., h is a natural number equal to or less than m), is shown. The second light-emitting element ED2 included in the pixel PXih may be one of the light-emitting elements R_ED21, R_ED22, B_ED21, B_ED22, G1_ED21, G1_ED22, G2_ED21, and G2_ED22. Hereinafter, components and signals that are the same as the components and signals described with reference to FIG. 10A are marked by the same reference signs, and thus, additional description will be omitted to avoid redundancy.

In an embodiment of the invention, the pixel PXih may include first to seventh transistors T1' and T2 to T7, the first capacitor Cst, the second capacitor Cbs, and a second light-emitting element ED2. Hereinafter, for convenience of description, the first transistor T1' in the pixel PXih is also referred to as the "second driving transistor T1'". Furthermore, the pixel PXih may further include the second shielding layer BML2. The second shielding layer BML2 may correspond to the second driving transistor T1'. The second shielding layer BML2 may receive a second common voltage through the shielding connection electrode BCNT. In an embodiment of the invention, the second common voltage may be the first gate driving voltage VGL. The second shielding layer BML2 may receive the first gate driving voltage VGL through the shielding connection electrode BCNT. However, the invention is not limited thereto. In an embodiment, the second common voltage may include the second gate driving voltage VGH (refer to FIG. 4), and the second shielding layer BML2 may receive the second gate driving voltage VGH through the shielding connection electrode BCNT.

In an embodiment of the invention, in the case where the first gate driving voltage VGL is applied to the second shielding layer BML2, a voltage corresponding to a first difference "ELVDD-VGL" is applied between a source electrode S1' of the second driving transistor T1' and the second shielding layer BML2 when the driving current $I_{LD}$ flows through the second driving transistor T1'. Accordingly, in addition to the gate electrode G1, a channel may be defined in a channel area GA1' (refer to FIG. 12) of the second driving transistor T1' by the second shielding layer BML2. Accordingly, when the first power supply voltage ELVDD is applied to the first and second driving transistors T1 and T1', and the data signals DSj and DSh, which have the same voltage level as each other, are respectively applied to the first and second driving transistors T1 and T1', the amount of the driving current $I_{LD}$, flowing through the second driving transistor T1' may be greater than the amount of the driving current $I_{LD}$ flowing through the first driving transistor T1.

In an embodiment of the invention, in the case where the second gate driving voltage VGH is applied to the second shielding layer BML2, a voltage corresponding to a second difference "ELVDD-VGH" is applied between the source electrode S1' of the second driving transistor T1' and the second shielding layer BML2 when the driving current $I_{LD}$ flows through the second driving transistor T1'. In this case, a depletion region generated in the channel area GA1' of the second driving transistor T1' increases, and, at the same time, the subthreshold swing of the second driving transistor T1' decreases. Accordingly, when the first power supply voltage ELVDD is applied to the first and second driving transistors T1 and T1' and the data signals DSj and DSh, which have the same voltage level as each other, are respectively applied to the first and second driving transistors T1 and T1', the amount of the driving current $I_{LD'}$ flowing through the second driving transistor T1' may be greater than the amount of the driving current $I_{LD}$ flowing through the first driving transistor T1.

Figure 11:
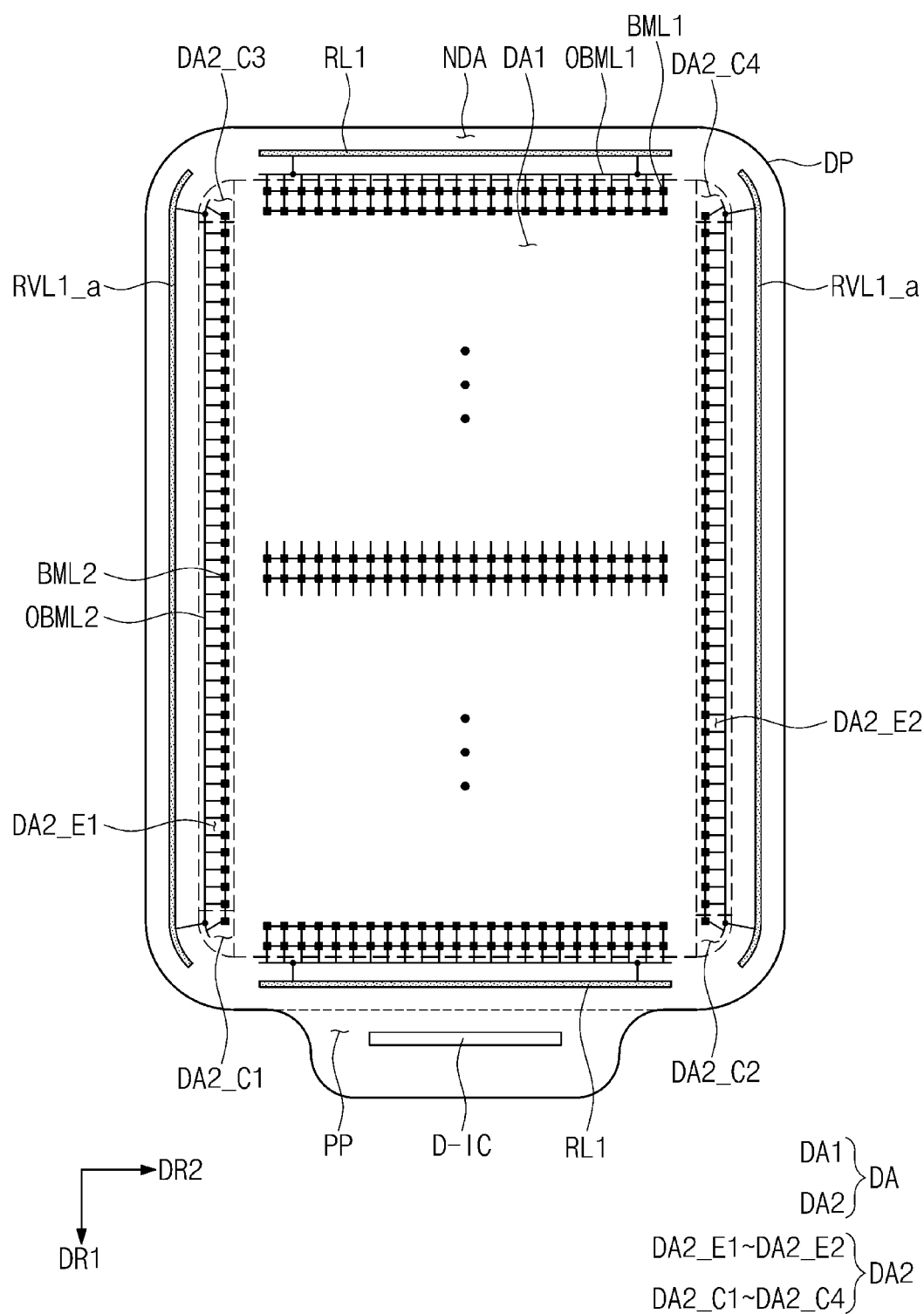
FIG. 11 is a plan view of an embodiment of a display panel, according to the invention.

FIG. 11 is a plan view of an embodiment of a display panel according to the invention. Hereinafter components that are the same as the components described with reference to FIGS. 5 and 7A are marked by the same reference numerals, and thus, additional description will be omitted to avoid redundancy.

Referring to FIGS. 5, 7A, and 11, the display panel DP includes a plurality of the first shielding layers BML1 disposed in the first display area DA1. The first shielding layers BML1 respectively correspond to the first driving transistors T1 (refer to FIG. 10A) in each of the first pixels PX1 (refer to FIG. 6). The first shielding layers BML1 may include a plurality of shielding electrodes, which respectively correspond to the first driving transistor T1 in each of the first pixels PX1 and which are electrically connected to each other. The first shielding layers BML1 may include a shape in which shielding electrodes are connected in a mesh shape. In an embodiment of the invention, the first shielding layers BML1 may be electrically connected to the first power supply line RL1, and may receive the first power supply voltage ELVDD (refer to FIG. 3) through the first power supply line RL1.

In an embodiment of the invention, the display panel DP may further include the two first outer lines OBML1, which extend in the second direction DR2 and which are spaced from each other in the first direction DR1. FIG. 11 illustrates that the first outer lines OBML1 are disposed in the non-display area NDA. However, the invention is not limited thereto. In an embodiment, the first outer lines OBML1 may be disposed in the first display area DA1. The first shielding layers BML1 may be electrically connected to the first outer lines OBML1. The first outer lines OBML1 are electrically connected to the first power supply line RL1, and may receive the first power supply voltage ELVDD through the first power supply line RL1. In an embodiment of the invention, the display panel DP may further include a first outer line extending in the first direction DR1. In this case, the first outer line extending in the first direction DR1 may be disposed in the first display area DA1. The first shielding layers BML1 may be electrically connected to the first outer line extending in the first direction DR1 and a first outer line OBML1 extending in the second direction DR2.

The display panel DP further includes a plurality of second shielding layers BML2 disposed in the second display area DA2. The second shielding layers BML2 respectively correspond to the second driving transistors T1' (refer to FIG. 10B) in each of the second pixels PX2 (refer to FIG. 6). The second shielding layers BML2 may include a plurality of shielding electrodes, which respectively correspond to the second driving transistor T1' in each of the second pixels PX2 and which are electrically connected to each other. The second shielding layers BML2 may include a shape in which shielding electrodes are connected in a mesh shape. In an embodiment of the invention, the second shielding layers BML2 may be electrically connected to the first sub voltage line RVL1_a, and may receive the first gate driving voltage VGL (refer to FIG. 3) through the first sub voltage line RVL1_a. In an embodiment of the invention, the first shielding layers BML1 and the second shielding layers BML2 may be spaced from each other and electrically insulated from each other.

In an embodiment of the invention, the display panel DP may further include the two second outer lines OBML2, which extend in the first direction DR1 and which are spaced from each other in the second direction DR2. FIG. 11 illustrates that the second outer lines OBML2 are disposed in the second display area DA2. However, the invention is not limited thereto. In an embodiment, the second outer lines OBML2 may be disposed in the non-display area NDA. The second shielding layers BML2 may be electrically connected to the second outer lines OBML2. The second shielding layers BML2 may be electrically connected to the first sub voltage line RVL1_a, and may receive the first gate driving voltage VGL (refer to FIG. 4) through the first sub voltage line RVL1_a.

Figure 12:
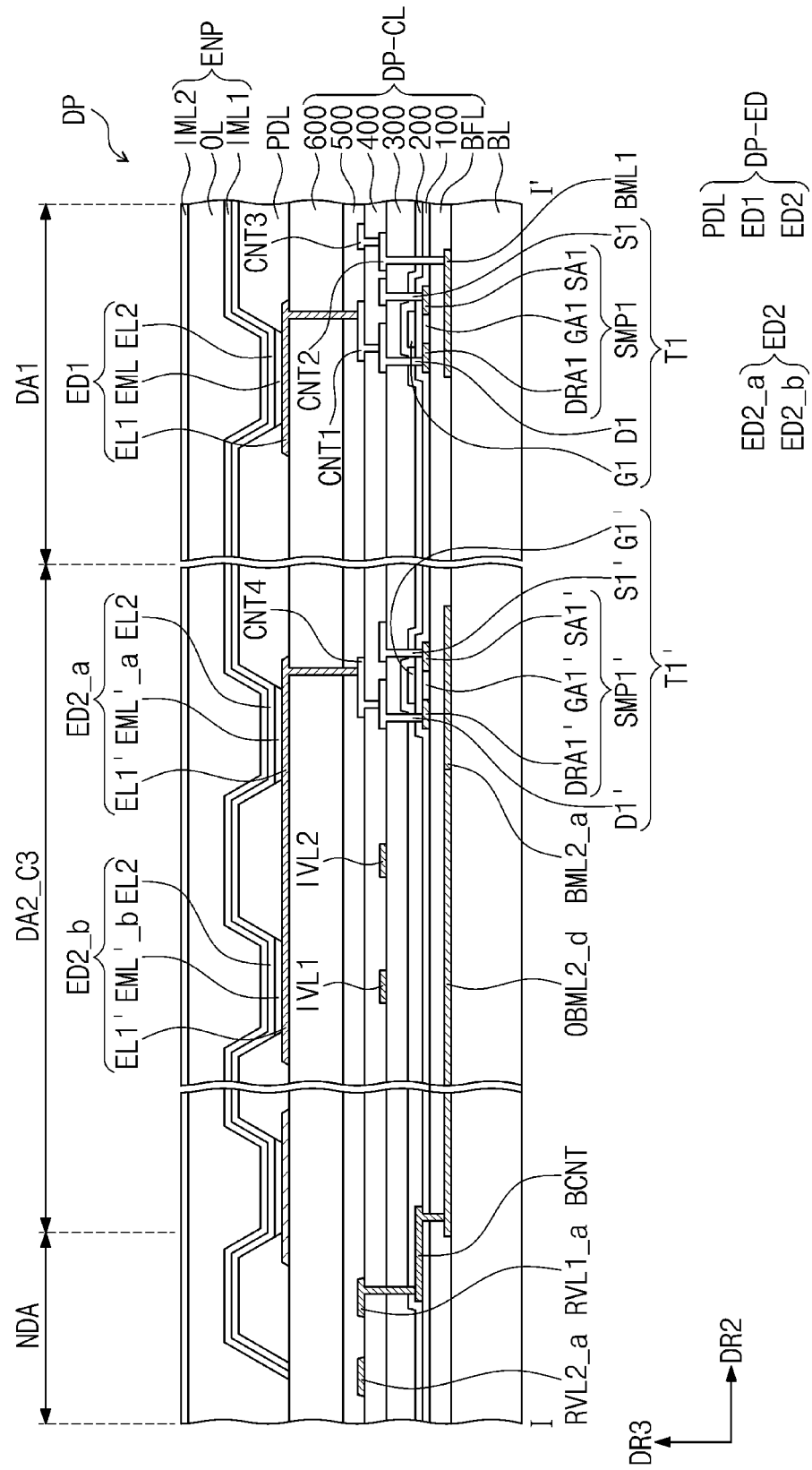
FIG. 12 is a cross-sectional view of a display device taken along line I-I' illustrated in FIG. 5.
Figure 13:
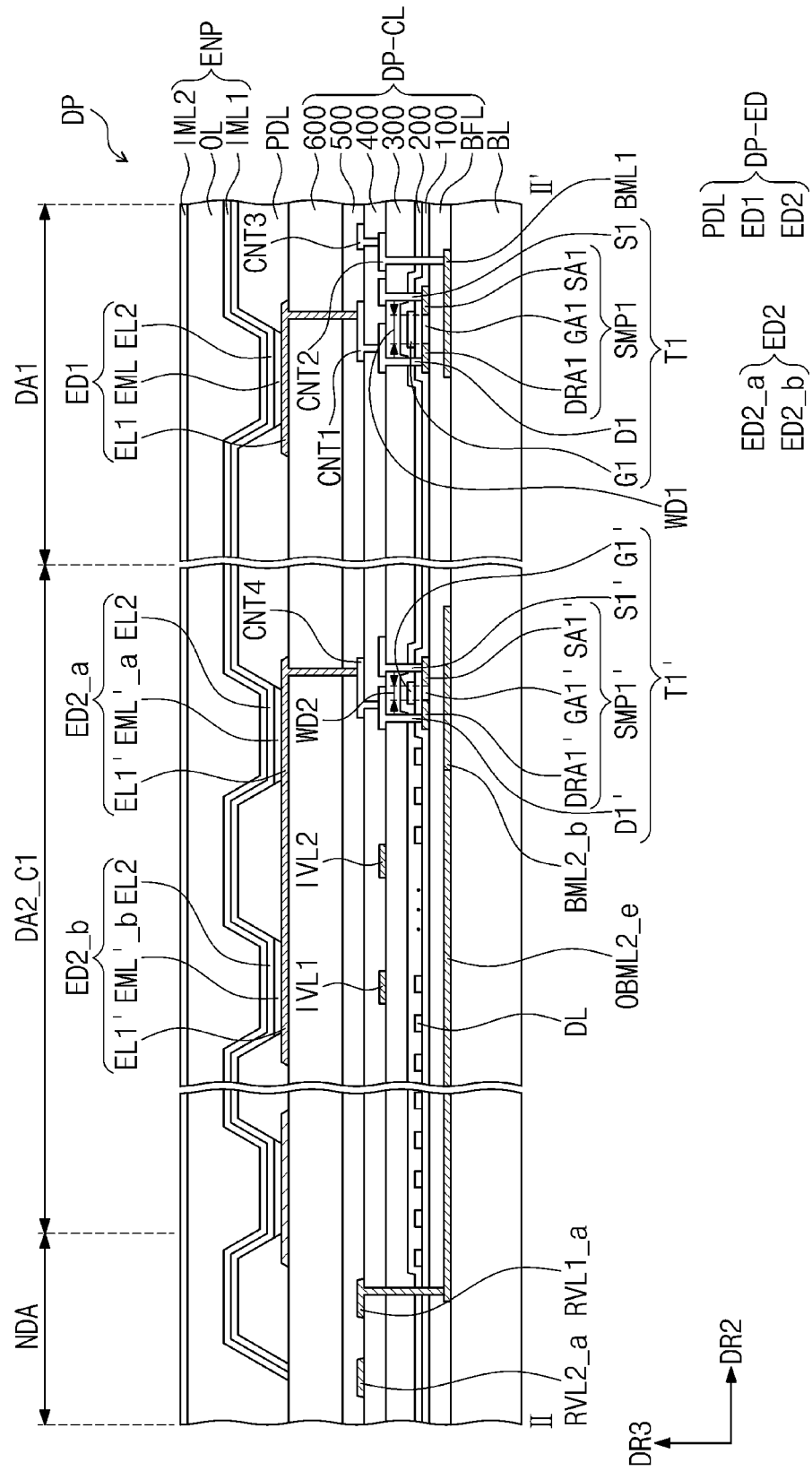
FIG. 13 is a cross-sectional view of a display device taken along line II-II' illustrated in FIG. 5.

FIG. 12 is a cross-sectional view of a display device taken along line I-I' illustrated in FIG. 5. FIG. 13 is a cross-sectional view of a display device taken along line II-II' illustrated in FIG. 5.

Referring to FIG. 12, the display panel DP includes a base layer BL, a circuit element layer DP-CL, a display element layer DP-ED, and an encapsulating layer ENP.

In an embodiment of the invention, the base layer BL may be a member to provide a base surface on which the circuit element layer DP-CL is disposed. The base layer BL may be a stack structure including a plastic substrate, an insulating film, or a plurality of insulating layers. In an embodiment of the invention, the base layer BL may include a synthetic resin layer. The synthetic resin layer may include a thermosetting resin material. In an embodiment, the base layer BL may have a three-layer structure of a synthetic resin layer, an adhesive layer, and a synthetic resin layer, for example. In particular, the synthetic resin layer may be a polyimide-based resin layer, and the material thereof is not specifically limited. The synthetic resin layer may include at least one of acrylic resin, methacrylic resin, polyisoprene, vinyl resin, epoxy resin, urethane resin, cellulose resin, siloxane resin, polyamide resin, and perylene resin. In addition, the base layer BL may include a glass substrate, a metal substrate, or an organic/inorganic composite material substrate.

The circuit element layer DP-CL may be disposed on the base layer BL. The circuit element layer DP-CL may include a plurality of intermediate insulating layers, a semiconductor pattern, a conductive pattern, a signal line. The intermediate insulating layer, the semiconductor layer, and the conductive layer may be formed or disposed on the base layer BL through a coating process, and a depositing process. Thereafter, the intermediate insulating layer, the semiconductor layer, and the conductive layer may be selectively patterned through a photolithography process. The semiconductor pattern, the conductive pattern, and the signal line included in the circuit element layer DP-CL may be formed or provided in such a manner.

In an embodiment of the invention, the circuit element layer DP-CL may include shielding layers BML1 and BML2_a, a second outer line OBML2_d, a buffer layer BFL, a first intermediate insulating layer 100, a second intermediate insulating layer 200, a third intermediate insulating layer 300, a fourth intermediate insulating layer 400, a fifth intermediate insulating layer 500 and a sixth intermediate insulating layer 600.

In an embodiment of the invention, the shielding layers BML1 and BML2_a may be disposed on the base layer BL. The shielding layers BML1 and BML2_a may be disposed on the base layer BL in which organic and inorganic layers are alternately stacked. An inorganic barrier layer may be further interposed between the shielding layers BML1 and BML2_a and the buffer layer BFL. The shielding layers BML1 and BML2_a may include a reflective metal. In an embodiment of the invention, the shielding layers BML1 and BML2_a may include molybdenum (Mo), an alloy including at least one of molybdenum (Mo), aluminum (Al), an alloy including at least one of aluminum (Al), an aluminum nitride (AlN), tungsten (W), a tungsten nitride (WN), copper (Cu), and p+ doped amorphous silicon. Each of the shielding layers BML1 and BML2_a may include the same material or may include different materials.

In an embodiment of the invention, the shielding layers BML1 and BML2_a include the first shielding layer BML1 and the second shielding layer BML2_a. The first shielding layer BML1 may overlap the first driving transistor T1. The second shielding layer BML2_a may overlap the second driving transistor T1'. The first shielding layer BML1 may prevent electrical characteristics of the first driving transistor T1 from being deteriorated due to the polarization of the base layer BL and external light. The second shielding layer BML2_a may prevent electrical characteristics of the second driving transistor T1' from being deteriorated due to the polarization of the base layer BL and external light.

In an embodiment of the invention, the second outer line OBML2_d may be disposed on the base layer BL. In an embodiment of the invention, the second outer line OBML2_d may include molybdenum (Mo), an alloy including at least one of molybdenum (Mo), aluminum (Al), an alloy including at least one of aluminum (Al), an aluminum nitride (AlN), tungsten (W), a tungsten nitride (WN), copper (Cu), and p+ doped amorphous silicon. The second outer line OBML2_d may include the same material as that of the first and second the shielding layers BML1 and BML2_a. Alternatively, the second outer line OBML2_d may include a material different from that of each of the first and second the shielding layers BML1 and BML2_a. The second outer line OBML2_d may be electrically connected to the second shielding layer BML2_a.

The buffer layer BFL may be disposed on the base layer BL. The buffer layer BFL may cover the first shielding layer BML1 and the second shielding layer BML2_a. The buffer layer BFL may improve a bonding force between the base layer BL and the semiconductor pattern. The buffer layer BFL may include an inorganic material. The buffer layer BFL may include a silicon oxide layer and a silicon nitride layer, and the silicon oxide layer and the silicon nitride layer may be alternately stacked.

The semiconductor patterns SMP1 and SMP1' may be disposed on the buffer layer BFL. The semiconductor patterns SMP1 and SMP1' may include polysilicon. However, the invention is not limited thereto, and the semiconductor patterns SMP1 and SMP1' may include amorphous silicon or a metal oxide.

FIG. 12 merely illustrates some of the semiconductor patterns SMP1 and SMP1', and a semiconductor pattern may be further disposed in another area of a pixel in a plan view. The semiconductor patterns SMP1 and SMP1' may be arranged in a predetermined rule, across pixels. The semiconductor patterns SMP1 and SMP1' may have a different electrical property depending on whether the semiconductor patterns SMP1 and SMP1' are doped. The semiconductor patterns SMP1 and SMP1' may include a first semiconductor area having high conductivity and a second semiconductor area having low conductivity. The first semiconductor area may be doped with N-type dopants or P-type dopants. A P-type transistor includes a doping area doped with the P-type dopants. The second semiconductor area may be a non-doping area or may be doped with a lighter concentration, as compared to the first semiconductor area.

The conductivity of the first semiconductor area is greater than that of the second semiconductor area. The source electrode and drain electrode of a transistor may be disposed on the first semiconductor area. However, the invention is not limited thereto. In an embodiment, the first semiconductor area may substantially function as an electrode or signal line. The second semiconductor area actually corresponds to a channel (or active) area of a transistor.

As illustrated in FIG. 12, a source area SA1, a drain area DRA1, and a channel area GA1 of the first driving transistor T1 are formed or provided from the first semiconductor pattern SMP1. A source area SA1', a drain area DRA1', and the channel area GA1' of the second driving transistor T1' are formed or provided from the second semiconductor pattern SMP1'. The source area SA1 and the drain area DRA1 of the first driving transistor T1 may extend in opposite directions to each other from the channel area GA1 on the cross-section. Moreover, the source area SA1' and the drain area DRA1' of the second driving transistor T1' may extend in opposite directions to each other from the channel area GA1' on the cross-section.

The first intermediate insulating layer 100 is disposed on the buffer layer BFL. The first intermediate insulating layer 100 overlaps a plurality of pixels in common to cover the first and second semiconductor patterns SMP1 and SMP1'. The first intermediate insulating layer 100 may be an inorganic layer and/or an organic layer, and may have a single-layer structure or a multi-layer structure. The first intermediate insulating layer 100 may include at least one of an aluminum oxide, a titanium oxide, a silicon oxide, a silicon oxynitride, a zirconium oxide, and a hafnium oxide. In an embodiment, the first intermediate insulating layer 100 may be a single-layer silicon oxide layer. Each of the second to sixth intermediate insulating layers 200, 300, 400, 500 and 600 as well as the first intermediate insulating layer 100 may be an inorganic layer and/or an organic layer, and may have a single-layer structure or a multi-layer structure. The inorganic layer may include at least one of the materials described above.

The gate electrode G1 of the first driving transistor T1 and the gate electrode G1' of the second driving transistor T1' are disposed on the first intermediate insulating layer 100. The gate electrode G1 of the first driving transistor T1 and the gate electrode G1' of the second driving transistor T1' may be some portions of a metal pattern. The gate electrode G1 of the first driving transistor T1 may overlap the channel area GA1 of the first driving transistor T1. The gate electrode G1' of the second driving transistor T1' may overlap the channel area GA1' of the second driving transistor T1'. In a process of doping the first and second semiconductor patterns SMP1 and SMP1', the gate electrode G1 of the first driving transistor T1 and the gate electrode G1' of the second driving transistor T1' may function as masks.

The second intermediate insulating layer 200 is disposed on the first intermediate insulating layer 100 to cover the gate electrode G1 of the first driving transistor T1 and the gate electrode G1' of the second driving transistor T1'. The second intermediate insulating layer 200 may be an inorganic layer and/or an organic layer, and may have a single-layer structure or a multi-layer structure. In an embodiment, the second intermediate insulating layer 200 may be a single-layer silicon oxide layer.

The third intermediate insulating layer 300 is disposed on the second intermediate insulating layer 200. The third intermediate insulating layer 300 may overlap pixels in common. The third intermediate insulating layer 300 may be an inorganic layer and/or an organic layer, and may have a single-layer structure or a multi-layer structure. In an embodiment, the third intermediate insulating layer 300 may be a single-layer silicon oxide layer.

The source electrode S1 of the first driving transistor T1, the drain electrode D1 of the first driving transistor T1, the source electrode S1' of the second driving transistor T1', the drain electrode D1' of the second driving transistor T1', the first initialization voltage line IVL1, the second initialization voltage line IVL2, and the second connection electrode CNT2 may be disposed on the third intermediate insulating layer 300.

The source electrode S1 of the first driving transistor T1 may be electrically connected to the source area SA1 of the first driving transistor T1 through a contact hole penetrating the first to third intermediate insulating layers 100, 200, and 300. The source electrode S1 of the first driving transistor T1 may be electrically connected to the drain electrode D5 (refer to FIG. 10A) of the fifth transistor T5 (refer to FIG. 10A).

The drain electrode D1 of the first driving transistor T1 may be electrically connected to the drain area DRA1 of the first driving transistor T1 through a contact hole penetrating the first to third intermediate insulating layers 100, 200, and 300.

The source electrode S1' of the second driving transistor T1' may be electrically connected to the source area SA1' of the second driving transistor T1' through a contact hole penetrating the first to third intermediate insulating layers 100, 200, and 300. The drain electrode D1' of the second driving transistor T1' may be electrically connected to the drain area DRA1' of the second driving transistor T1' through a contact hole penetrating the first to third intermediate insulating layers 100, 200, and 300.

The first initialization voltage line IVL1 and the second initialization voltage line IVL2 are disposed on the third intermediate insulating layer 300 in the third corner area DA2_C3.

The second connection electrode CNT2 may be electrically connected to the first shielding layer BML1 through a contact hole penetrating the buffer layer BFL and the first to third intermediate insulating layers 100, 200, and 300.

The fourth intermediate insulating layer 400 may be disposed on the third intermediate insulating layer 300. The fourth intermediate insulating layer 400 may be a single-layer silicon oxide layer. the fourth intermediate insulating layer 400 may cover the source electrode S1 of the first driving transistor T1, the drain electrode D1 of the first driving transistor T1, the source electrode S1' of the second driving transistor T1', the drain electrode D1' of the second driving transistor T1', the first initialization voltage line IVL1, the second initialization voltage line IVL2, and the second connection electrode CNT2.

A first connection electrode CNT1, a third connection electrode CNT3, a fourth connection electrode CNT4, the first sub voltage line RVL1_a, and the second sub voltage line RVL2_a are disposed on the fourth intermediate insulating layer 400

The first connection electrode CNT1 may be electrically connected to the drain electrode D1 of the first driving transistor T1 through a contact hole penetrating the fourth intermediate insulating layer 400. The third connection electrode CNT3 may be electrically connected to the second connection electrode CNT2 through a contact hole penetrating the fourth intermediate insulating layer 400. The third connection electrode CNT3 may be electrically connected to the first power supply line RL1 (refer to FIG. 11). The first shielding layer BML1 may receive the first power supply voltage ELVDD (refer to FIG. 10A) from the first power supply line RL1 through the second and third connection electrodes CNT2 and CNT3. The fourth connection electrode CNT4 may be electrically connected to the drain electrode D1' of the second driving transistor T1' through a contact hole penetrating the fourth intermediate insulating layer 400.

The fifth intermediate insulating layer 500 is disposed on the fourth intermediate insulating layer 400. The fifth intermediate insulating layer 500 may be an organic layer and/or an inorganic layer. The fifth intermediate insulating layer 500 may cover the first connection electrode CNT1, the third connection electrode CNT3, the fourth connection electrode CNT4, the first sub voltage line RVL1_a, and the second sub voltage line RVL2_a.

The sixth intermediate insulating layer 600 is disposed on the fifth intermediate insulating layer 500. The sixth intermediate insulating layer 600 may be an organic layer. In an embodiment of the invention, the sixth intermediate insulating layer 600 may include polyimide. In an embodiment of the invention, the sixth intermediate insulating layer 600 may provide a flat surface on which the display element layer DP-ED is provided.

The display element layer DP-ED may be formed or disposed on the circuit element layer DP-CL. In an embodiment of the invention, the display element layer DP-ED may include the light-emitting elements ED1 and ED2 and a pixel defining layer PDL.

The light-emitting elements ED1 and ED2 include the first light-emitting element ED1 disposed in the first display area DA1 and the second light-emitting element ED2 disposed in the third corner area DA2_C3. The first light-emitting element ED1 may include the first electrode EL1 disposed on the circuit element layer DP-CL, a first light-emitting layer EML disposed on the first electrode ELL and the second electrode EL2 disposed on the first light-emitting layer EML.

In an embodiment of the invention, the second light-emitting element ED2 may include a first sub light-emitting element ED2_a and a second sub light-emitting element ED2_b. Referring to FIG. 6, the first sub light-emitting element ED2_a may correspond to the second red light-emitting element R_ED21 connected adjacent to the second red driving circuit R_PD2, the third green light-emitting element G1_ED21 connected adjacent to the second green driving circuit G1_PD2, the fourth green light-emitting element G2_ED21 connected adjacent to the third green driving circuit G2_PD2, and the second blue light-emitting element B_ED21 connected adjacent to the second blue driving circuit B_PD2. The second sub light-emitting element ED2_b may correspond to the remaining second red light-emitting element R_ED22 driven by the second red driving circuit R_PD2, the remaining third green light-emitting element G1_ED22 driven by the second green driving circuit G1_PD2, the remaining fourth green light-emitting element G2_ED22 driven by the third green driving circuit G2_PD2, and the remaining second blue light-emitting element B_ED22 driven by the second blue driving circuit B_PD2.

The first sub light-emitting element ED2_a may include a third electrode ELF disposed on the circuit element layer DP-CL, a first sub light-emitting layer EML'_a disposed on the third electrode ELF, and the second electrode EL2 disposed on the first sub light-emitting layer EML'_a. The second sub light-emitting element ED2_b may include the third electrode ELF disposed on the circuit element layer DP-CL, a second sub light-emitting layer EML'_b disposed on the third electrode ELF, and the second electrode EL2 disposed on the second sub light-emitting layer EML'_b. In an embodiment of the invention, the first sub light-emitting layer EML'_a and the second sub light-emitting layer EML'_b may be disposed on one third electrode EL1' disposed on the circuit element layer DP-CL. Furthermore, in an embodiment of the invention, the second electrode EL2 that is included in the first light-emitting element ED1, the first sub light-emitting element ED2_a, and the second sub light-emitting element ED2_b may be provided in a form of one electrode. In an embodiment of the invention, the display element layer DP-ED may further include light-emitting elements disposed in a direction opposite to the second direction DR2 from the second light-emitting element ED2.

The first electrode EL1 and the third electrode EL1' are disposed on the sixth intermediate insulating layer 600. The first electrode EL1 is electrically connected to the first connection electrode CNT1 through a contact hole penetrating the fifth and sixth intermediate insulating layers 500 and 600. Accordingly, the first electrode EL1 is electrically connected to the drain electrode D1 of the first driving transistor T1. The third electrode EL1' is electrically connected to the fourth connection electrode CNT4 through a contact hole penetrating the fifth and sixth intermediate insulating layers 500 and 600. Accordingly, the third electrode ELF is electrically connected to the drain electrode D1' of the second driving transistor T1'.

The pixel defining layer PDL may be disposed on the sixth intermediate insulating layer 600 and may cover a portion of the first electrode EU and the third electrode ELF. A pixel opening is defined in the pixel defining layer PDL. The pixel opening exposes at least part of the first electrode EU and at least part of the third electrode EL1'.

The first light-emitting layer EML is disposed on the first electrode EL1. The first sub light-emitting layer EML'_a and the second sub light-emitting layer EML'_b are disposed on the third electrode EL1'. Each of the first light-emitting layer EML, the first sub light-emitting layer EML'_a, and the second sub light-emitting layer EML'_b may be disposed in an area corresponding to the pixel opening. That is, the first light-emitting layer EML, the first sub light-emitting layer EML'_a, and the second sub light-emitting layer EML'_b may be separately disposed in each of the pixels. The first light-emitting layer EML, the first sub light-emitting layer EML'_a, and the second sub light-emitting layer EML'_b may include a light-emitting material including a fluorescent material or a phosphorescent material. The light-emitting material may include an organic light-emitting material or an inorganic light-emitting material, but is not limited any one of the organic light-emitting material and the inorganic light-emitting material.

The second electrode EL2 is disposed on the first light-emitting layer EML, the first sub light-emitting layer EML'_a, and the second sub light-emitting layer EML'_b. The second electrode EL2 is provided in a form of one common electrode and is disposed in the plurality of pixels in common.

The encapsulating layer ENP may be disposed on the display element layer DP-ED. The encapsulating layer ENP may be disposed on the second electrode EL2.

The encapsulating layer ENP is disposed in the plurality of pixels in common. In an embodiment, the encapsulating layer ENP may directly cover the second electrode EL2. In an embodiment of the invention, a capping layer may be further interposed between the encapsulating layer ENP and the second electrode EL2 to cover the second electrode EL2. In this case, the encapsulating layer ENP may directly cover the capping layer.

The encapsulating layer ENP may include a first inorganic layer IML1, an organic layer OL, and a second inorganic layer IML2. The first inorganic layer IML1 and the second inorganic layer IML2 protect the first and second light-emitting elements ED1 and ED2 from moisture and oxygen, and the organic layer OL protects the first and second light-emitting elements ED1 and ED2 from a foreign substance such as a dust particle. The first inorganic layer IML1 and the second inorganic layer IML2 may include a silicon nitride layer, a silicon oxynitride layer, a silicon oxide layer, a titanium oxide layer, or an aluminum oxide layer. The organic layer OL may include an acryl-based organic layer, but is not limited thereto.

The first inorganic layer IML1 may be disposed on the first and second light-emitting elements ED1 and ED2. The organic layer OL is disposed on the first inorganic layer IML1. The second inorganic layer IML2 may be disposed on the organic layer OL.

In an embodiment of the invention, the display panel DP may further include the shielding connection electrode BCNT. The shielding connection electrode BCNT may be interposed between the first intermediate insulating layer 100 and the second intermediate insulating layer 200. The shielding connection electrode BCNT may be electrically connected to the second outer line OBML2_d through a contact hole penetrating the buffer layer BFL and the first intermediate insulating layer 100. In an embodiment of the invention, the shielding connection electrode BCNT may be disposed in the same layer as the gate electrodes G1 and G1'.

In an embodiment of the invention, the first sub voltage line RVL1_a may be electrically connected to the shielding connection electrode BCNT through a contact hole penetrating the second to fourth intermediate insulating layers 200, 300, and 400. The first gate driving voltage VGL (refer to FIG. 3) may be applied from the first sub voltage line RVL1_a to the second shielding layer BML2_a through the shielding connection electrode BCNT and the second outer line OBML2_d. However, the invention is not limited thereto. In an embodiment, the second outer line OBML2_d may be omitted, and the second shielding layer BML2_a may extend in a direction opposite to the second direction DR2 so as to be electrically connected to the shielding connection electrode BCNT, for example. Also, the second shielding layer BML2_a may extend in a direction opposite to the second direction DR2 so as to be electrically connected to the first sub voltage line RVL1_a through a contact hole penetrating the first to fourth intermediate insulating layers 100, 200, 300, and 400.

FIG. 13 is a cross-sectional view of the display panel DP taken along line II-II' illustrated in FIG. 5. Below, components that are the same as the components described with reference to FIG. 12 are marked by the same reference numerals, and thus, additional description will be omitted to avoid redundancy.

Referring to FIGS. 3, 5, 12, and 13, unlike a cross-sectional view of the display panel DP taken along line I-I', a cross-sectional view of the display panel DP taken along line II-II' shows a part of the data lines DL among the plurality of data lines DL1 to DLm that connect the display panel DP to the source driving block SDB included in the driver chip D-IC. The data line DL may be interposed between the first intermediate insulating layer 100 and the second intermediate insulating layer 200.

A second outer line OBML2_e may extend in a direction opposite to the second direction DR2 and may be electrically connected to the first sub voltage line RVL1_a through a contact hole penetrating the first to fourth intermediate insulating layers 100, 200, 300, and 400. However, the invention is not limited thereto. In an embodiment, the second outer line OBML2_e may be omitted, and the second shielding layer BML2_b may extend in a direction opposite to the second direction DR2 so as to be electrically connected to the first sub voltage line RVL1_a.

In an embodiment of the invention, the channel area GA1 of the first driving transistor T1 may have a first length WD1. The channel area GA1' of the second driving transistor T1' may have a second length WD2 less than the first length WD1. Accordingly, when the first power supply voltage ELVDD (refer to FIG. 3) and the data signal DS (refer to FIG. 3), which have the same voltage level as each other, are respectively applied to the first and second driving transistors T1 and T1', the amount of the driving current $I_{LD'}$ (refer to FIG. 10B) flowing through the second driving transistor T1' may be greater than the amount of the driving current $I_{LD}$ (refer to FIG. 10A) flowing through the first driving transistor T1.

Although embodiments of the invention have been described for illustrative purposes, those skilled in the art will appreciate that various modifications, and substitutions are possible, without departing from the scope and spirit of the invention as disclosed in the accompanying claims.

Accordingly, the technical scope of the invention is not limited to the detailed description of this specification, but should be defined by the claims.

In an embodiment of the invention, because a second display area has more space constraints than a first display area where first pixels are disposed, driving characteristics of second pixels in the second display area may be deteriorated. To solve these issues, a voltage greater than a voltage applied to a first shielding layer included in the first pixels may be applied to a second shielding layer. Accordingly, a current that is greater than a current flowing through a driving transistor included in the first pixels may flow into a driving transistor included in the second pixels. As a result, it is possible to improve driving characteristics of the second pixels, and to prevent the display quality from being deteriorated in a second display area.

While the disclosure has been described with reference to embodiments thereof, it will be apparent to those of ordinary skill in the art that various changes and modifications may be made thereto without departing from the spirit and scope of the invention as set forth in the following claims.

What is claimed is:

1. A display device comprising:
    a display panel which displays an image and including a first display area, in which a plurality of first pixels is disposed, and a second display area which is adjacent to the first display area and in which a plurality of second pixels is disposed; and
    a gate driving block which overlaps the second display area and transmits driving signals to the first pixels and the second pixels,
    wherein each of the plurality of first pixels includes a first shielding layer,
    wherein each of the plurality of second pixels includes a second shielding layer, and
    wherein a first common voltage is applied to the first shielding layer, and a second common voltage having a voltage level different from a voltage level of the first common voltage is applied to the second shielding layer.

2. The display device of claim 1, wherein the first shielding layer and the second shielding layer are spaced apart from each other and to be electrically insulated from each other.

3. The display device of claim 1, wherein each of the plurality of first pixels further includes:
    a first light-emitting element; and
    a first driving transistor electrically connected to the first light-emitting element,
    wherein the first shielding layer corresponds to the first driving transistor,
    wherein each of the second pixels further includes:
    a second light-emitting element; and
    a second driving transistor electrically connected to the second light-emitting element, and
    wherein the second shielding layer corresponds to the second driving transistor.

4. The display device of claim 3, wherein each of the second pixels further includes:
    at least one dummy light-emitting element electrically connected to the second driving transistor.

5. The display device of claim 3, wherein a length of a channel area of the first driving transistor is greater than a length of a channel area of the second driving transistor.

6. The display device of claim 1, further comprising:
    a reference voltage line, which is electrically connected to the gate driving block and to which the second common voltage is applied.

7. The display device of claim 6, wherein the second common voltage includes:
    a first gate driving voltage having a first voltage level; and
    a second gate driving voltage having a second voltage level higher than the first voltage level, and
    wherein the reference voltage line includes:
    a first driving voltage line to which the first gate driving voltage is applied; and
    a second driving voltage line to which the second gate driving voltage is applied.

8. The display device of claim 7, wherein the second shielding layer is electrically connected to the first driving voltage line.

9. The display device of claim 7, wherein the second shielding layer is electrically connected to the second driving voltage line.

10. The display device of claim 6, wherein the driving signals include a scan signal applied to the plurality of first pixels and the second pixels, and
    wherein the gate driving block includes:
    a first signal generation block which generates the scan signal.

11. The display device of claim 10, wherein the reference voltage line includes:
    a first reference voltage line which applies the second common voltage to the first signal generation block, and
    wherein the second shielding layer is electrically connected to the first reference voltage line.

12. The display device of claim 10, wherein the driving signals further includes an initialization scan signal, which is applied to the plurality of first pixels and the second pixels and which is different from the scan signal, and
    wherein the gate driving block further includes:
    a second signal generation block which generates the initialization scan signal.

13. The display device of claim 12, wherein the reference voltage line includes:
a second reference voltage line which applies the second common voltage to the second signal generation block, and
wherein the second shielding layer is electrically connected to the second reference voltage line.

14. The display device of claim 12, wherein the driving signals further include an emission signal which controls timing at which the plurality of first pixels and the second pixels emit light, and
wherein the gate driving block further includes:
a third signal generation block which generates the emission signal.

15. The display device of claim 14, wherein the reference voltage line includes:
a third reference voltage line which applies the second common voltage to the third signal generation block, and
wherein the second shielding layer is electrically connected to the third reference voltage line.

16. The display device of claim 1, wherein each of the first shielding layer and the second shielding layer includes a plurality of shielding layers,
wherein the plurality of shielding layers of the first shielding layer is electrically connected to one another, and
wherein the plurality of shielding layers of the second shielding layer is electrically connected to one another.

17. The display device of claim 16, wherein the display panel further includes:
an outer line interposed between the gate driving block and the second shielding layers and which is electrically connected to the second shielding layers, and
wherein the second common voltage is applied to the outer line.

18. A display device comprising:
a display panel which displays an image and including a first display area, in which a plurality of first pixels is disposed, and a second display area which is adjacent to the first display area and in which a plurality of second pixels is disposed;
a gate driving block which transmits driving signals to the plurality of first pixels and the second pixels;
a common voltage line, which is electrically connected to the plurality of first pixels and the second pixels and to which a first common voltage is applied; and
a reference voltage line, which is electrically connected to the gate driving block and which is used to apply a second common voltage having a voltage level different from the first common voltage to the gate driving block,
wherein each of the plurality of first pixels includes a first shielding layer,
wherein each of the second pixels includes a second shielding layer, and
wherein the first common voltage is applied to the first shielding layer, and the second common voltage is applied to the second shielding layer.

19. The display device of claim 18, wherein the first shielding layer and the second shielding layer are spaced apart from each other and to be electrically insulated from each other.

20. The display device of claim 18, wherein each of the plurality of first pixels further includes:
a first light-emitting element; and
a first driving transistor electrically connected to the first light-emitting element,
wherein the first shielding layer corresponds to the first driving transistor,
wherein each of the second pixels further includes:
a second light-emitting element; and
a second driving transistor electrically connected to the second light-emitting element, and
wherein the second shielding layer corresponds to the second driving transistor.

21. The display device of claim 20, wherein each of the second pixels further includes:
at least one dummy light-emitting element electrically connected to the second driving transistor.

22. The display device of claim 20, further comprising:
a voltage generation block which generates the first common voltage and the second common voltage, applies the first common voltage to the common voltage line, and applies the second common voltage to the reference voltage line.

23. The display device of claim 22, wherein the second common voltage includes:
a first gate driving voltage having a first voltage level; and
a second gate driving voltage having a second voltage level higher than the first voltage level, and
wherein the reference voltage line includes:
a first driving voltage line which receives the first gate driving voltage from the voltage generation block; and
a second driving voltage line which receives the second gate driving voltage from the voltage generation block.

24. The display device of claim 23, wherein the first shielding layer is electrically connected to the common voltage line, and
wherein the second shielding layer is electrically connected to the first driving voltage line.

25. The display device of claim 23, wherein the first shielding layer is electrically connected to the common voltage line, and
wherein the second shielding layer is electrically connected to the second driving voltage line.

26. The display device of claim 18, wherein the gate driving block overlaps the second display area.

* * * * *